United States Patent
Pachamuthu et al.

(10) Patent No.: US 9,659,956 B1
(45) Date of Patent: May 23, 2017

(54) THREE-DIMENSIONAL MEMORY DEVICE CONTAINING SOURCE SELECT GATE ELECTRODES WITH ENHANCED ELECTRICAL ISOLATION

(71) Applicant: SANDISK TECHNOLOGIES INC., Plano, TX (US)

(72) Inventors: Jayavel Pachamuthu, San Jose, CA (US); Tuan Pham, San Jose, CA (US); Henry Chien, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/989,206

(22) Filed: Jan. 6, 2016

(51) Int. Cl.
| H01L 27/115 | (2006.01) |
| H01L 27/11582 | (2017.01) |
| H01L 27/11556 | (2017.01) |
| H01L 29/24 | (2006.01) |
| H01L 27/11565 | (2017.01) |
| H01L 27/11575 | (2017.01) |

(52) U.S. Cl.
CPC .. *H01L 27/11582* (2013.01); *H01L 27/11556* (2013.01); *H01L 27/11565* (2013.01); *H01L 27/11575* (2013.01); *H01L 29/24* (2013.01)

(58) Field of Classification Search
CPC .................................. H01L 27/115–27/11597
See application file for complete search history.

(56) References Cited

U.S. PATENT DOCUMENTS

| 5,915,167 | A | 6/1999 | Leedy | |
| 8,680,604 | B2 * | 3/2014 | Higashi | H01L 27/11578 257/324 |
| 9,023,719 | B2 | 5/2015 | Pachamuthu et al. | |
| 9,230,973 | B2 | 1/2016 | Pachamuthu et al. | |
| 9,230,979 | B1 | 1/2016 | Pachamuthu et al. | |
| 9,230,987 | B2 | 1/2016 | Pachamuthu et al. | |
| 9,478,558 | B2 * | 10/2016 | Koka | H01L 27/11582 |
| 9,484,357 | B2 * | 11/2016 | Makala | H01L 27/11582 |
| 2012/0199897 | A1 * | 8/2012 | Chang | H01L 21/8221 257/314 |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Jose R Diaz

(74) *Attorney, Agent, or Firm* — The Marbury Law Group PLLC

(57) ABSTRACT

A method of manufacturing a three-dimensional memory device includes forming, a bottom dielectric layer, a bottom sacrificial material layer, and an alternating stack of insulating layers and spacer material layers over a semiconductor substrate, forming a memory opening, forming an epitaxial channel portion and a memory stack structure in the memory opening, forming a backside contact trench, forming a first backside recess by selectively removing the bottom sacrificial material layer, forming a semiconductor oxide layer underneath the bottom dielectric layer and around a material of the epitaxial channel portion, forming second backside recesses by selectively removing the spacer material layers, and forming electrically conductive layers in the first and second backside recesses.

13 Claims, 20 Drawing Sheets

(56) References Cited

U.S. PATENT DOCUMENTS

2013/0161821 A1* 6/2013 Hwang ............... H01L 23/5283
                                                257/773
2016/0379989 A1* 12/2016 Sharangpani ..... H01L 27/11582
                                                257/314

OTHER PUBLICATIONS

Wong, M. et al., "Wafer Temperature Dependence of the Vapor-Phase HF Oxide Etch," J. Electrochem., Soc., vol. 140, No. 1, pp. 205-208, (1993).
U.S. Appl. No. 14/314,274, filed Jun. 27, 2014, SanDisk Corporation.
U.S. Appl. No. 14/341,079, filed Jul. 25, 2014, SanDisk Corporation.
U.S. Appl. No. 14/643,280, filed Mar. 10, 2014, SanDisk Corporation.
U.S. Appl. No. 14/927,708, filed Oct. 30, 2015, SanDisk Corporation.
U.S. Appl. No. 14/927,990, filed Oct. 30, 2015, SanDisk Corporation.

* cited by examiner

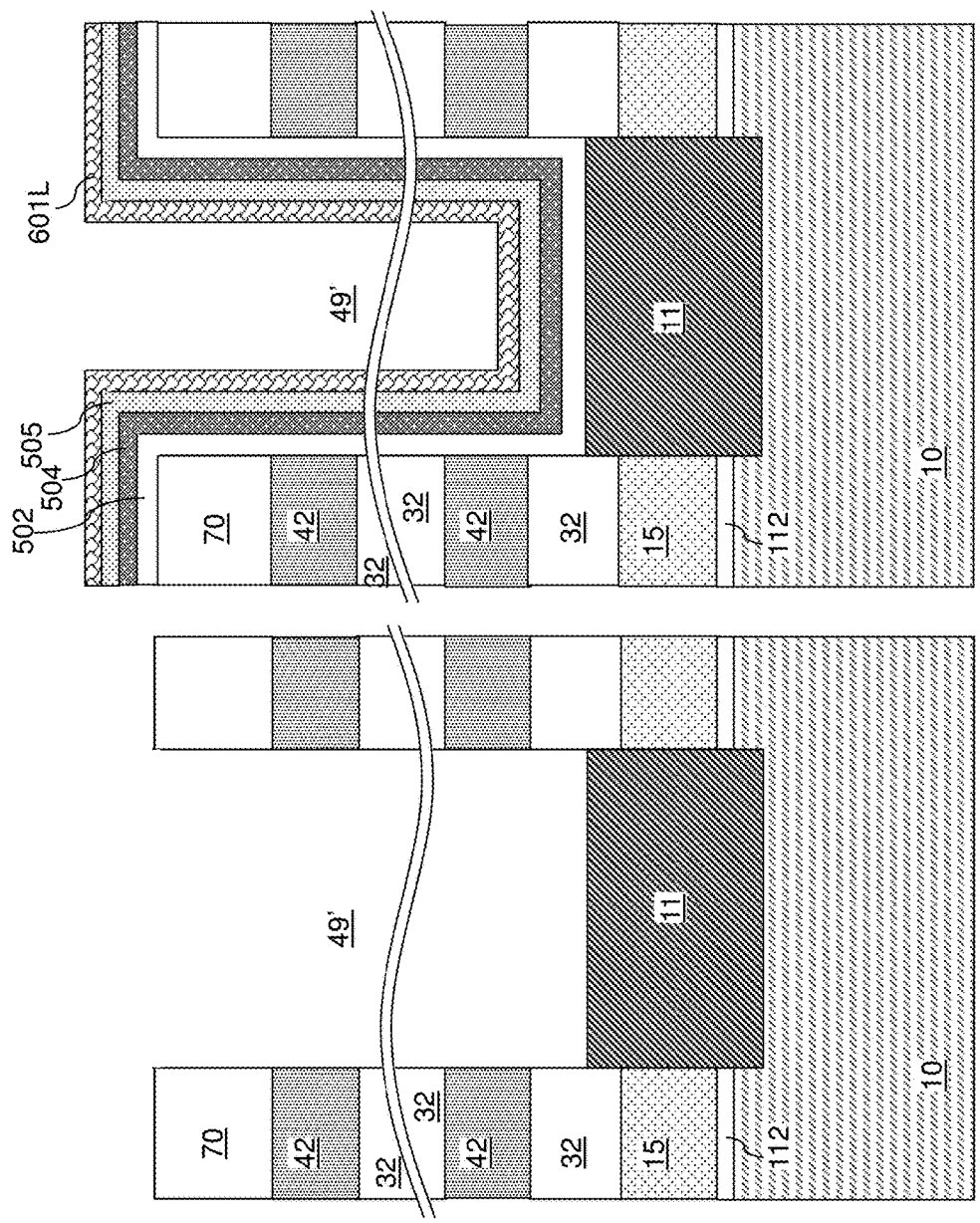

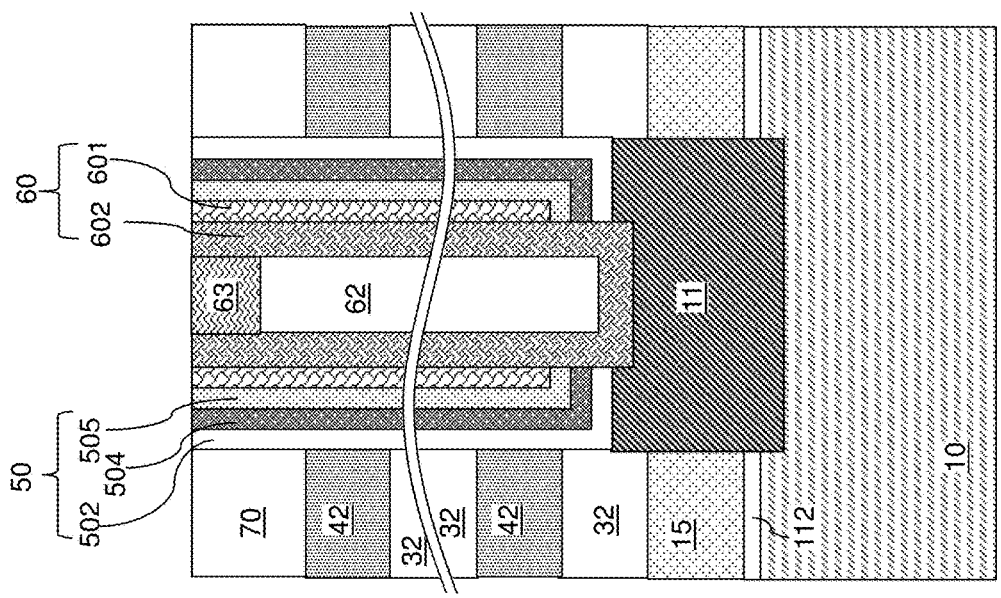
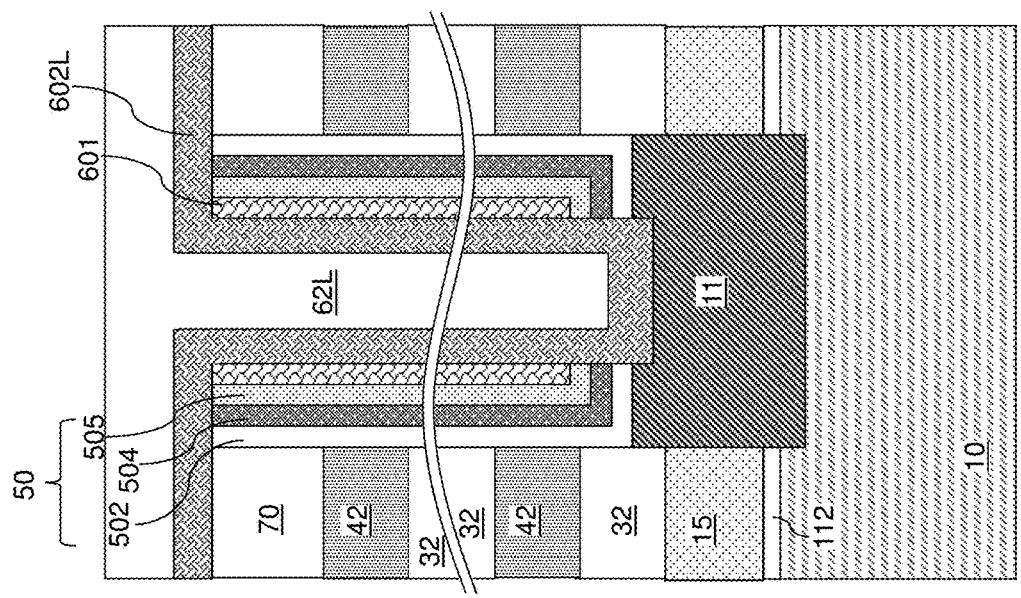
FIG. 4F
FIG. 4E

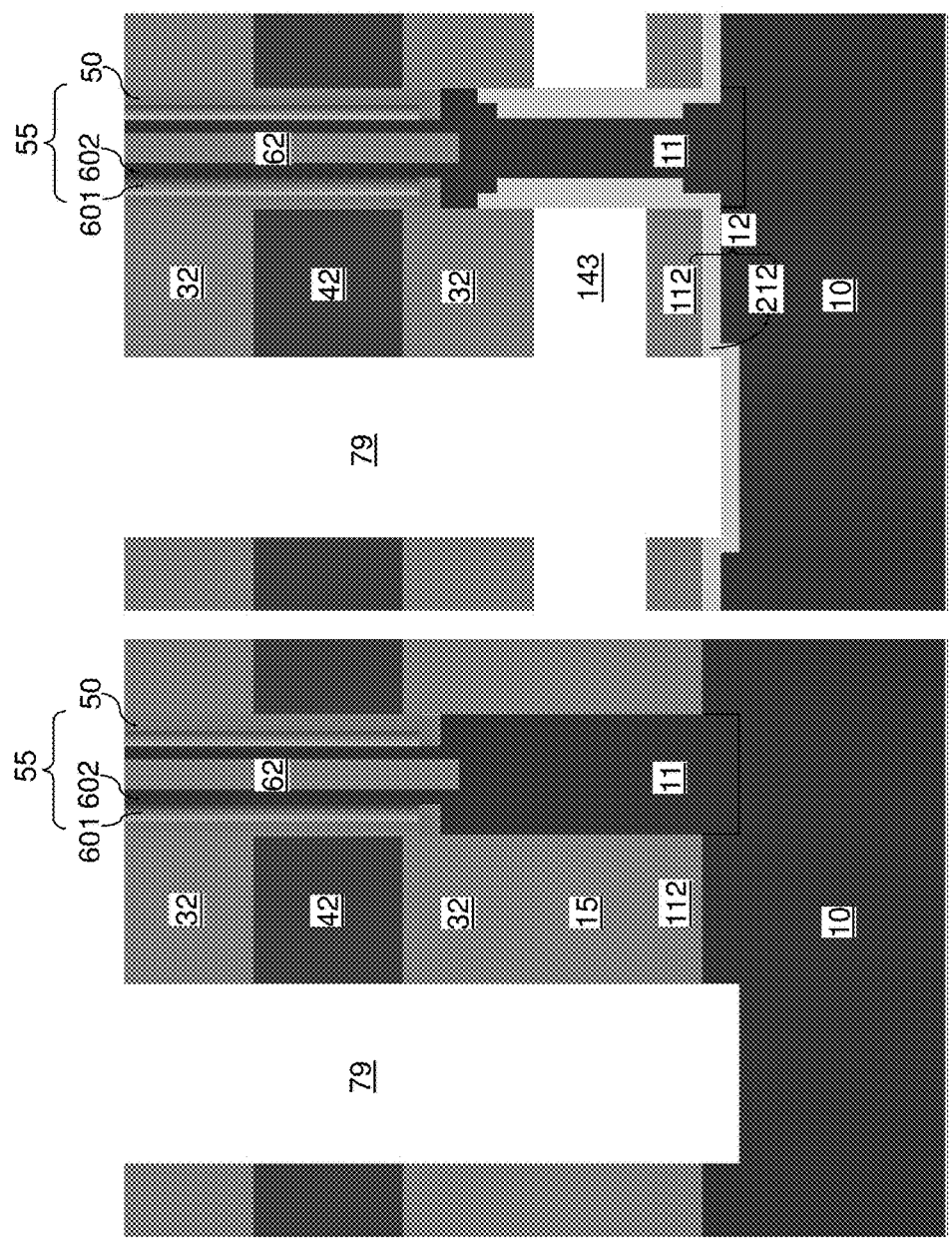

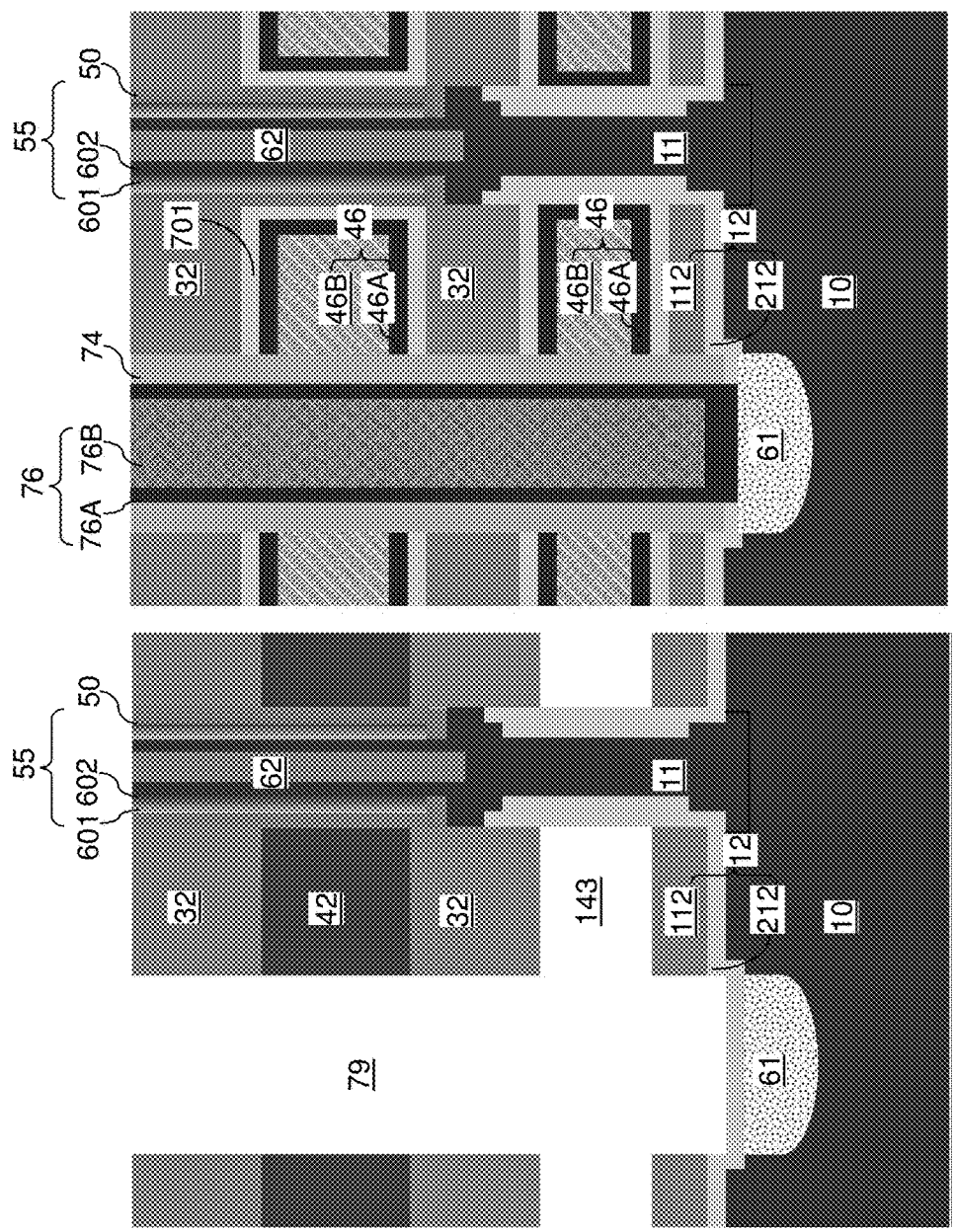

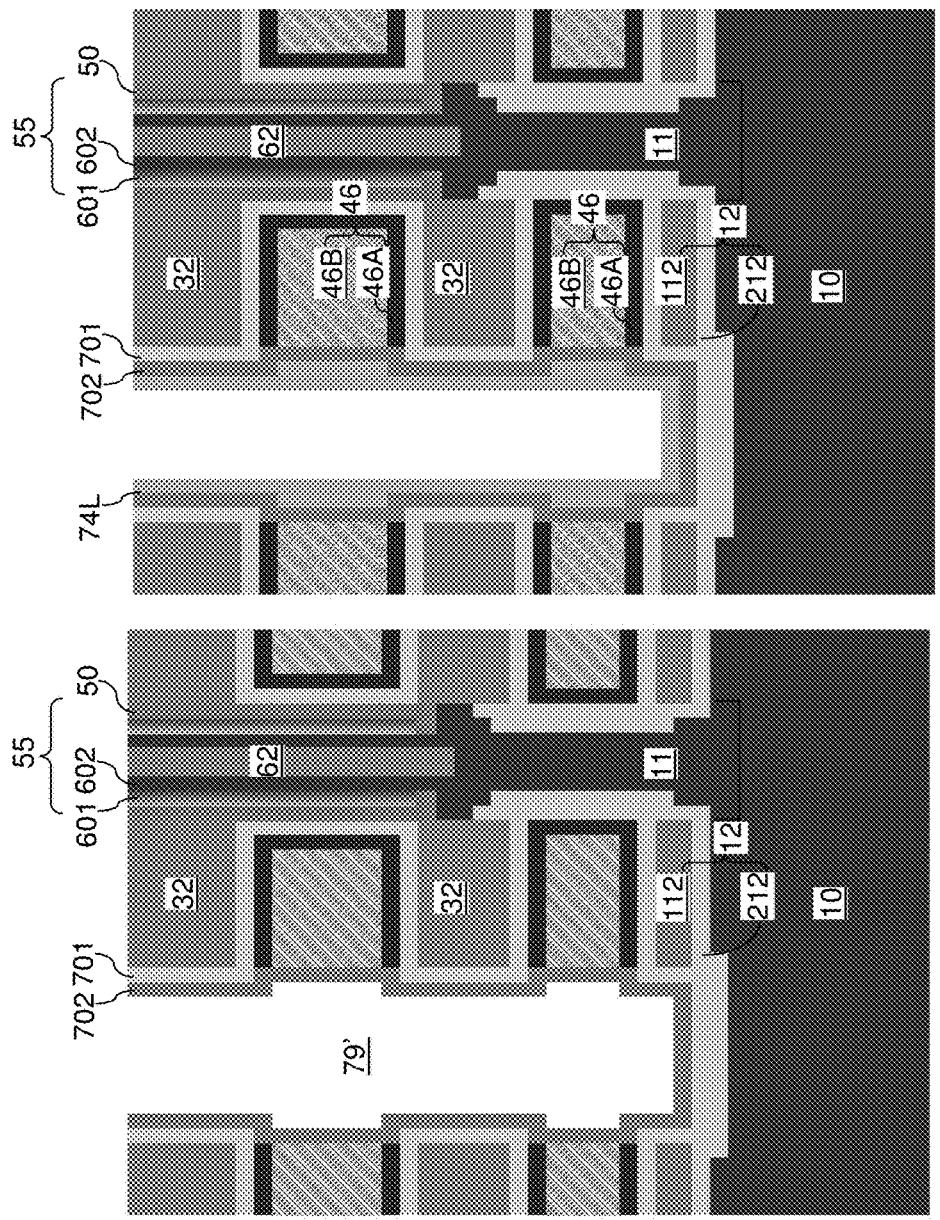

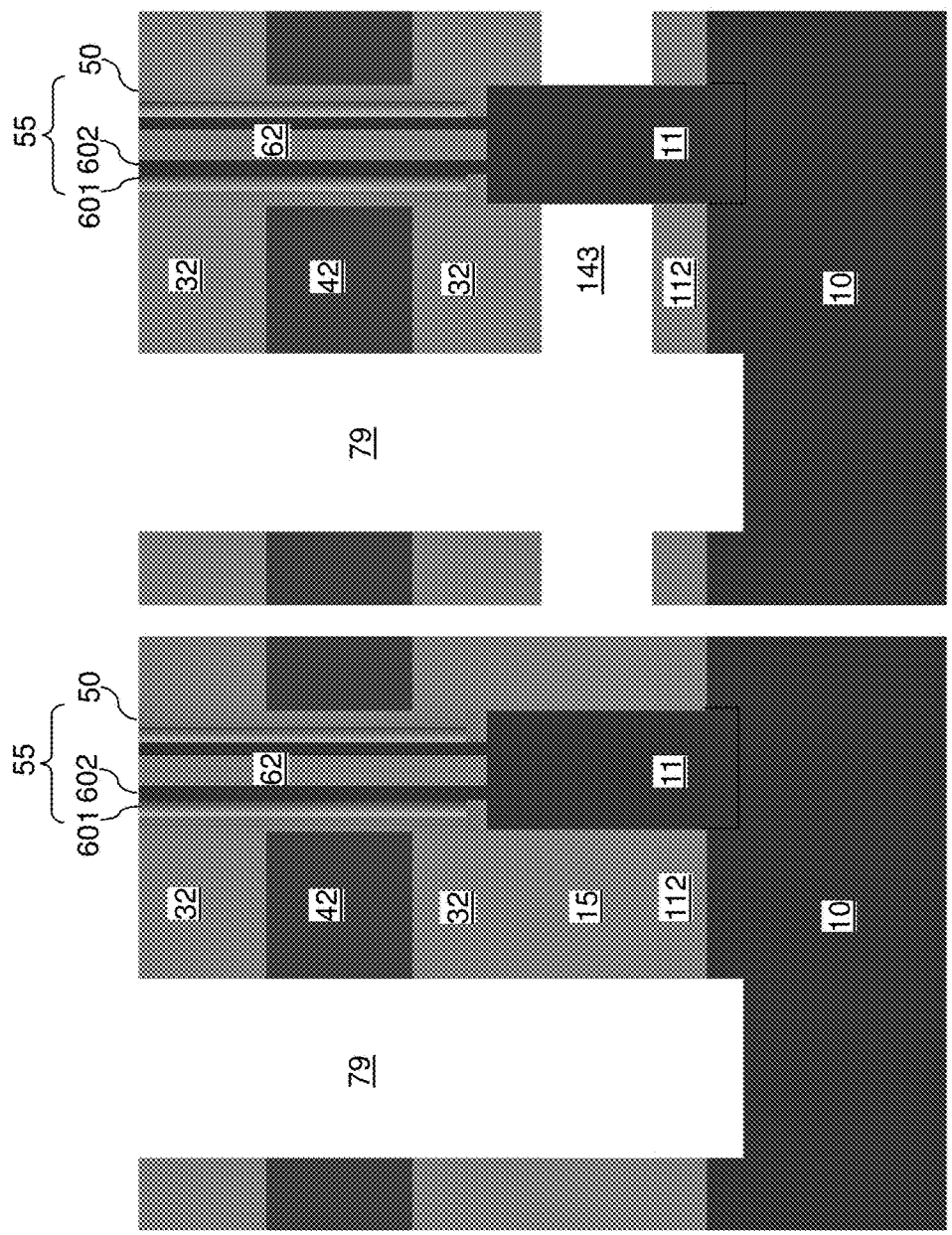

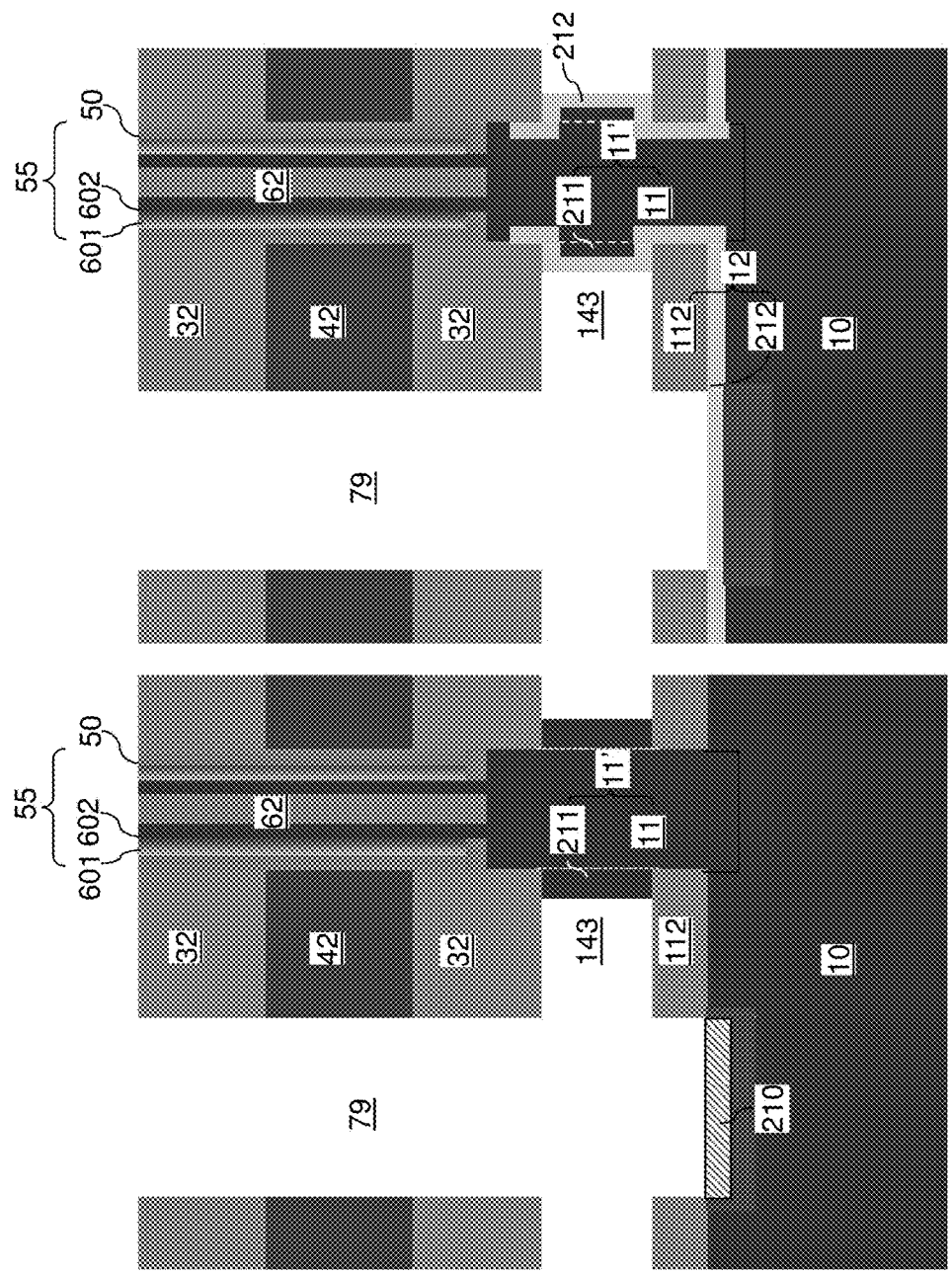

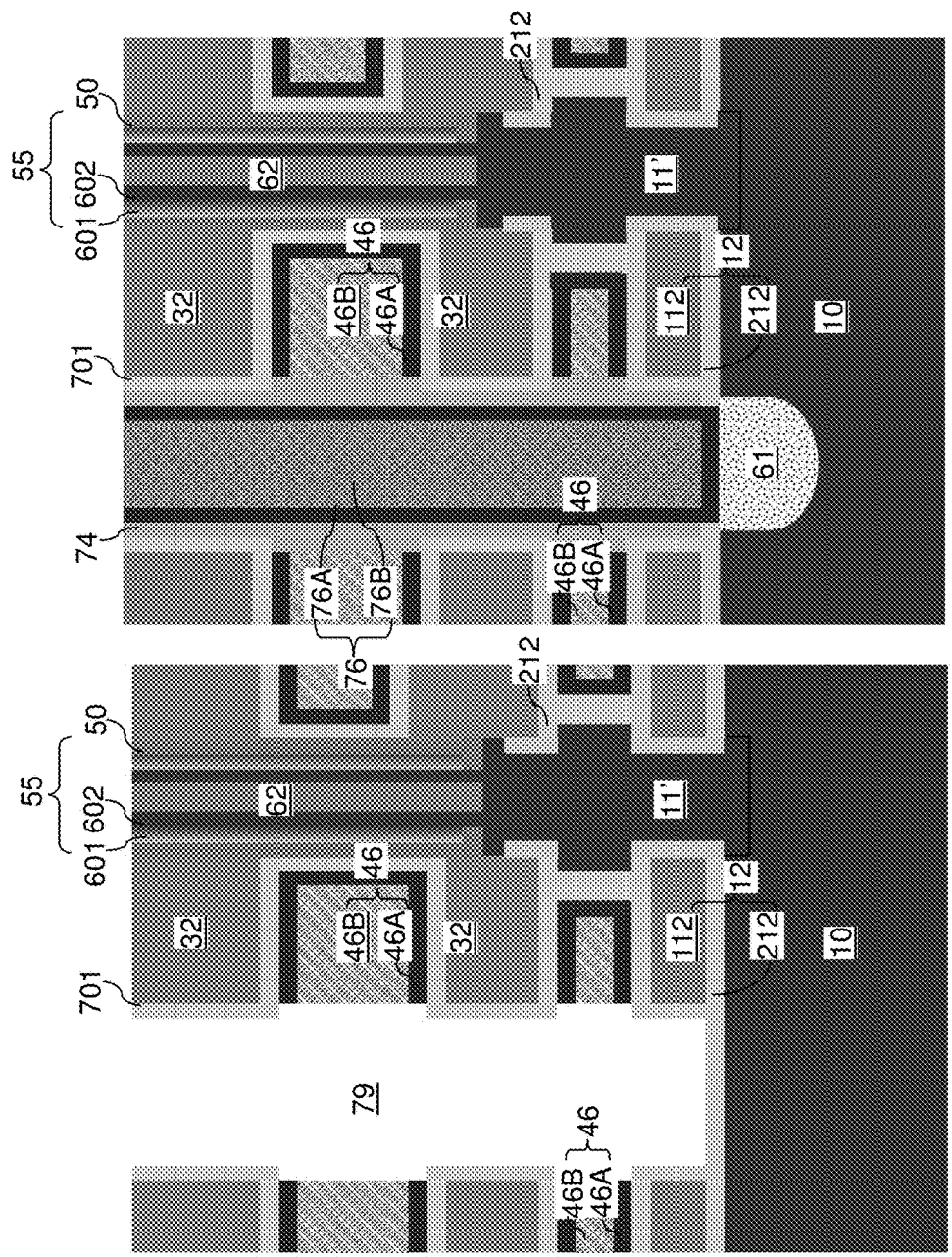

THREE-DIMENSIONAL MEMORY DEVICE CONTAINING SOURCE SELECT GATE ELECTRODES WITH ENHANCED ELECTRICAL ISOLATION

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a three-dimensional memory device is provided, which comprises the steps of: forming, from bottom to top, a bottom dielectric layer, a bottom sacrificial material layer, and an alternating stack of insulating layers and spacer material layers over a semiconductor substrate; forming a memory opening through the alternating stack, the bottom sacrificial material layer, and the bottom dielectric layer; forming an epitaxial channel portion and a memory stack structure in the memory opening; forming a backside contact trench through the alternating stack, the bottom sacrificial material layer, and the bottom dielectric layer; forming a first backside recess by removing the bottom sacrificial material layer selective to the insulating layers, the spacer material layers, and the bottom dielectric layer; forming a semiconductor oxide layer underneath the bottom dielectric layer and around a material of the epitaxial channel portion; forming second backside recesses by removing the spacer material layers selective to the insulating layers, the bottom dielectric layer, and the semiconductor oxide layer; and forming electrically conductive layers in the first and second backside recesses.

According to another aspect of the present disclosure, a monolithic three-dimensional memory device is provided, which comprises: an alternating stack of insulating layers and electrically conductive layers located over a semiconductor substrate; a memory stack structure extending through an upper portion of the alternating stack and comprising, from outside to inside, memory elements, a tunneling dielectric, and a vertical semiconductor channel; and an epitaxial channel portion underlying the memory stack structure and contacting a bottom surface of the vertical semiconductor channel and a portion of a top surface of the semiconductor substrate. A sidewall of the epitaxial channel portion laterally protrudes outward from a vertical plane including an interface between sidewalls of the alternating stack and a sidewall of the memory stack structure.

According to yet another aspect of the present disclosure, a monolithic three-dimensional memory device is provided, which comprises: an alternating stack of insulating layers and electrically conductive layers located over a semiconductor substrate; a memory stack structure extending through an upper portion of the alternating stack and comprising, from outside to inside, memory elements, a tunneling dielectric, and a vertical semiconductor channel; a source region located in an upper portion of the semiconductor substrate; a contact via structure extending through the alternating stack and contacting the source region; and an insulating spacer laterally surrounding the contact via structure and comprising a dielectric material liner that contact the contact via structure and an aluminum oxide liner that surrounds the dielectric material liner.

BRIEF DESCRIPTION OF THE DRAWINGS

FIGS. 4A-4F are sequential vertical cross-sectional views of a memory opening within the exemplary structure during various processing steps employed to form a memory stack structure according to an embodiment of the present disclosure.

FIGS. 8A-8D are sequential vertical cross-sectional views of the exemplary structure during a first exemplary processing sequence for forming electrically conductive layers according to a first embodiment of the present disclosure.

FIGS. 9A-9G are sequential vertical cross-sectional views of the exemplary structure during a second exemplary processing sequence for forming electrically conductive layers according to a second embodiment of the present disclosure.

FIGS. 10A-10F are sequential vertical cross-sectional views of the exemplary structure during a third exemplary processing sequence for forming electrically conductive layers according to a third embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
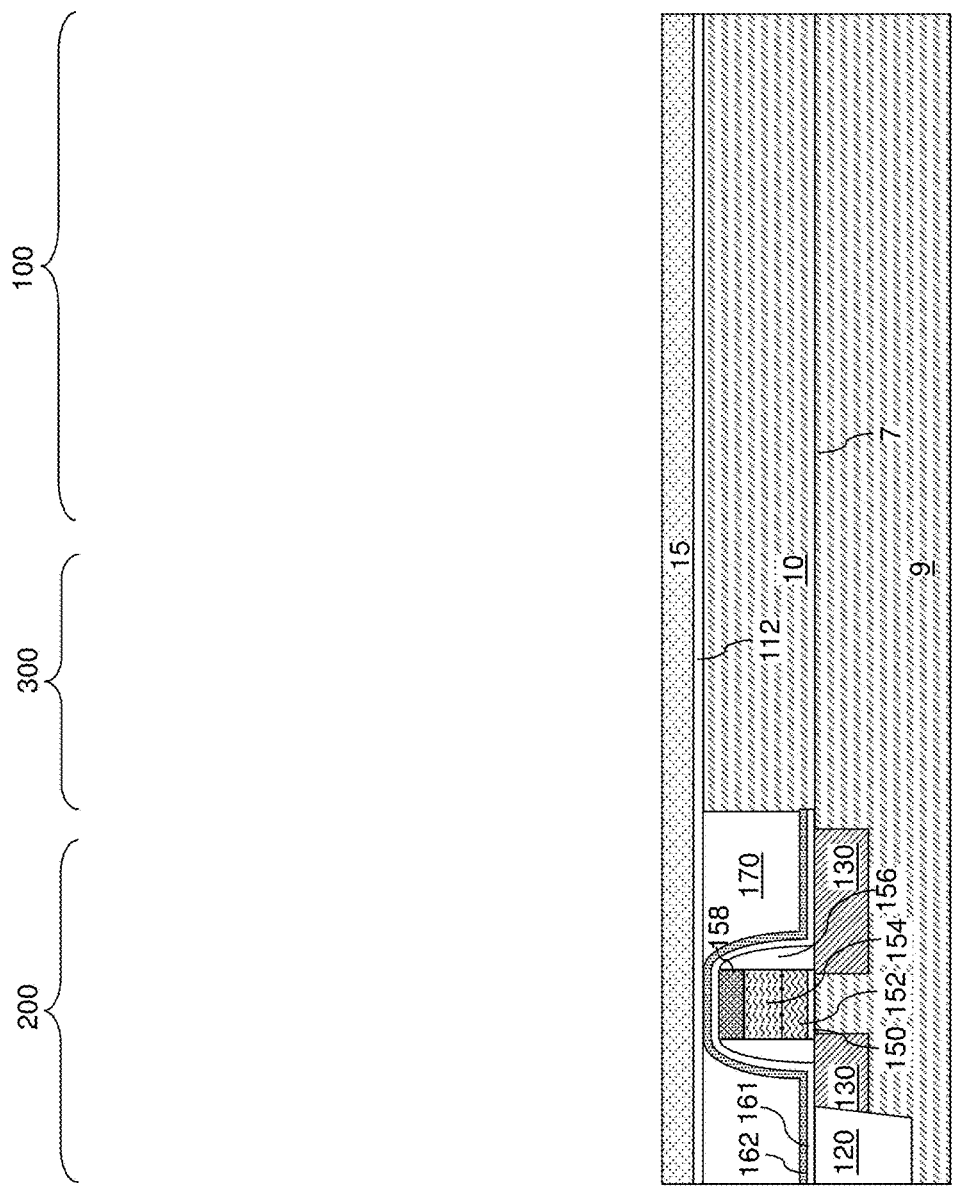
FIG. 1 is a vertical cross-sectional view of an exemplary structure after formation of a bottom sacrificial material layer according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art, such as a single crystalline silicon wafer or layer. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (e.g., a p-type doped well, not expressly shown) can be formed within the substrate semiconductor layer 9 and/or in the semiconductor material layer 10.

At least one semiconductor device for a peripheral circuitry can be formed in a region of the exemplary structure, which is herein referred to as a peripheral device region 200. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first bottom dielectric layer 161 and a second bottom dielectric layer 162 can be optionally formed. Each of the first and second bottom dielectric layers (161, 162) can comprise a silicon oxide layer, a silicon nitride layer, and/or a dielectric metal oxide layer. In an illustrative example, the first bottom dielectric layer 161 can be a silicon oxide layer, and the second bottom dielectric layer 162 can be a silicon nitride layer. The least one semiconductor device for the peripheral circuitry can contain a driver circuit for memory devices to be subsequently formed, which can include at least one NAND device.

As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. Dielectric metal oxide can have a dielectric constant greater than 7.9, i.e., can have a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. Dielectric metal oxides can be deposited, for example, by chemical vapor deposition (CVD), atomic layer deposition (ALD), pulsed laser deposition (PLD), liquid source misted chemical deposition, or a combination thereof.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the bottom dielectric layers (161, 162). Subsequently, the planarization dielectric layer 170 and the bottom dielectric layers (161, 162) can be removed from an area to physically expose a top surface of the substrate semiconductor layer 9.

The exemplary structure further includes a device region 100 in which an array of memory stack structures is to be subsequently formed, and a contact region 300 in which stepped surfaces of electrically conductive layers and contact via structures are to be subsequently formed. An optional semiconductor material layer 10 can be formed in the device region 100 and the contact region 300. The optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above (e.g., single crystalline silicon). The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

A bottom dielectric layer 112 can be formed over the semiconductor material layer 10 and optionally above the planarization dielectric layer 170. In case the semiconductor material layer 10 is not employed, the bottom dielectric layer 112 can be formed directly on the top surface of the substrate semiconductor layer 9. The bottom dielectric layer 112 can be formed directly on the top surface of a semiconductor substrate (9, 10).

The bottom dielectric layer 112 can be, for example, a silicon oxide layer or a dielectric metal oxide layer. The bottom dielectric layer 112 can be formed by conversion of a surface portion of a semiconductor material within a semiconductor substrate (9, 10) (such as a surface portion of the semiconductor material layer 10), and/or by deposition of a dielectric material, for example, by chemical vapor deposition (CVD) and/or atomic layer deposition. The thickness of the bottom dielectric layer 112 can be in a range from 3 nm to 30 nm, although lesser and greater thicknesses can also be employed. The bottom dielectric layer 112 can be employed as a portion of a gate dielectric for source side select transistors that are subsequently formed and are employed to select a set of semiconductor channels to be activated during operation of a NAND array. Specifically, the source side select transistors control current flow through a horizontal semiconductor channel that underlies the bottom dielectric layer 112, which functions as a gate dielectric for the source side select transistors.

Subsequently, a bottom sacrificial material layer 15 is formed on the bottom dielectric layer 112. The bottom sacrificial material layer 15 can comprise a material that can be removed selective to the materials of insulating layers and spacer material layers to be subsequently formed, and selective to the materials of the bottom dielectric layer 112 and the topmost layer of the semiconductor substrate (9, 10) (such as the semiconductor material layer 10). In one embodiment, the bottom sacrificial material layer 15 includes a material selected from amorphous semiconductor material, a polycrystalline semiconductor material, a doped silicate glass (e.g., borosilicate glass, BSG, phosphosilicate glass, PSG or borophosphosilicate glass, BPSG), organosilicate glass, and a porous dielectric material. For example, the bottom sacrificial material layer 15 can include amorphous or polycrystalline germanium, amorphous or polycrystalline silicon-germanium alloy, amorphous or polycrystalline silicon (in case the semiconductor material layer 10 comprises single crystalline silicon or a material different from silicon), phosphosilicate glass, borosilicate glass, borophosphosilicate glass, fluorosilicate glass, organosilicate glass, or a porous dielectric material derived any of the above. The bottom sacrificial material layer 15 can be deposited, for example, by chemical vapor deposition or spin coating. The thickness of the bottom sacrificial material layer 15 can be in a range from 20 nm to 100 nm, although lesser and greater thicknesses can also be employed.

Figure 2:
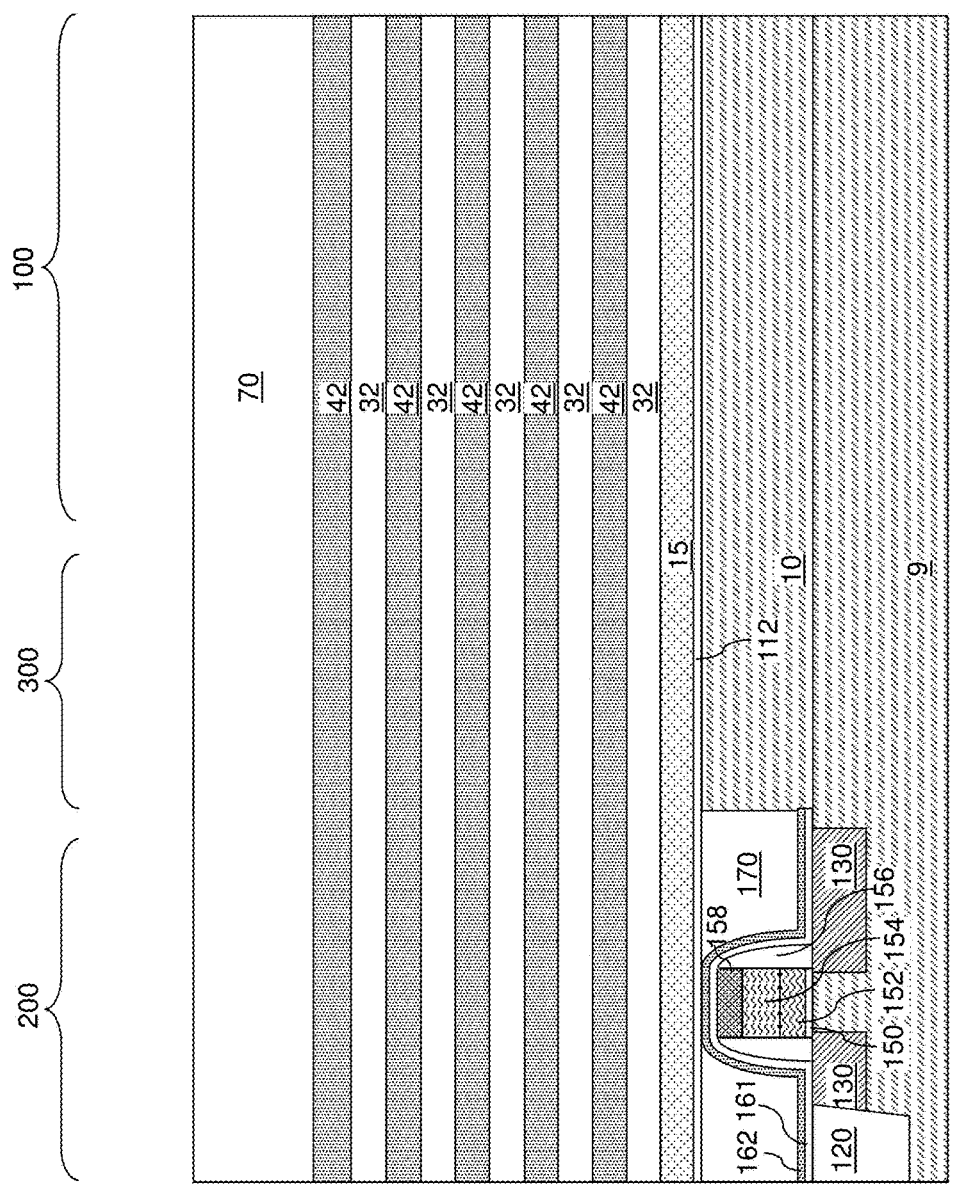
FIG. 2 is a vertical cross-sectional view of the exemplary structure after formation of an alternating stack of first material layers and second material layers and an insulating cap layer according to an embodiment of the present disclosure.

Referring to FIG. 2, a stack of an alternating plurality of first material layers (which can be insulating layers 32) and second material layers (which can be spacer material layers 42) is formed over the top surface of the substrate, which can be, for example, on the top surface of the bottom sacrificial material layer 15. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer (i.e., each spacer material layer 42) can be a sacrificial material layer. In this case, the stack can include an alternating plurality of insulating layers 32 and spacer material layers 42 that include a sacrificial material.

The stack of the alternating plurality is herein referred to as an alternating stack (32, 42). In one embodiment, the alternating stack (32, 42) can include insulating layers 32 composed of the first material, and spacer material layers 42 composed of a second material different from that of insulating layers 32. The first material of the insulating layers 32 can be at least one electrically insulating material. As such, each insulating layer 32 can be an electrically insulating material layer. Electrically insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the spacer material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The spacer material layers 42 may comprise an electrically insulating material, a semiconductor material, or a conductive material. The second material of the spacer material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the spacer material layers 42 can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the spacer material layers 42 can be formed, for example, CVD or atomic layer deposition (ALD).

The thicknesses of the insulating layers 32 and the spacer material layers 42 can be in a range from 20 nm to 50 nm, although lesser and greater thicknesses can be employed for each insulating layer 32 and for each spacer material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each spacer material layer 42 in the alternating stack (32, 42) can have a uniform thickness that is substantially invariant within each respective spacer material layer 42.

Optionally, an insulating cap layer 70 can be formed over the alternating stack (32, 42). The insulating cap layer 70 includes a dielectric material that is different from the material of the spacer material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
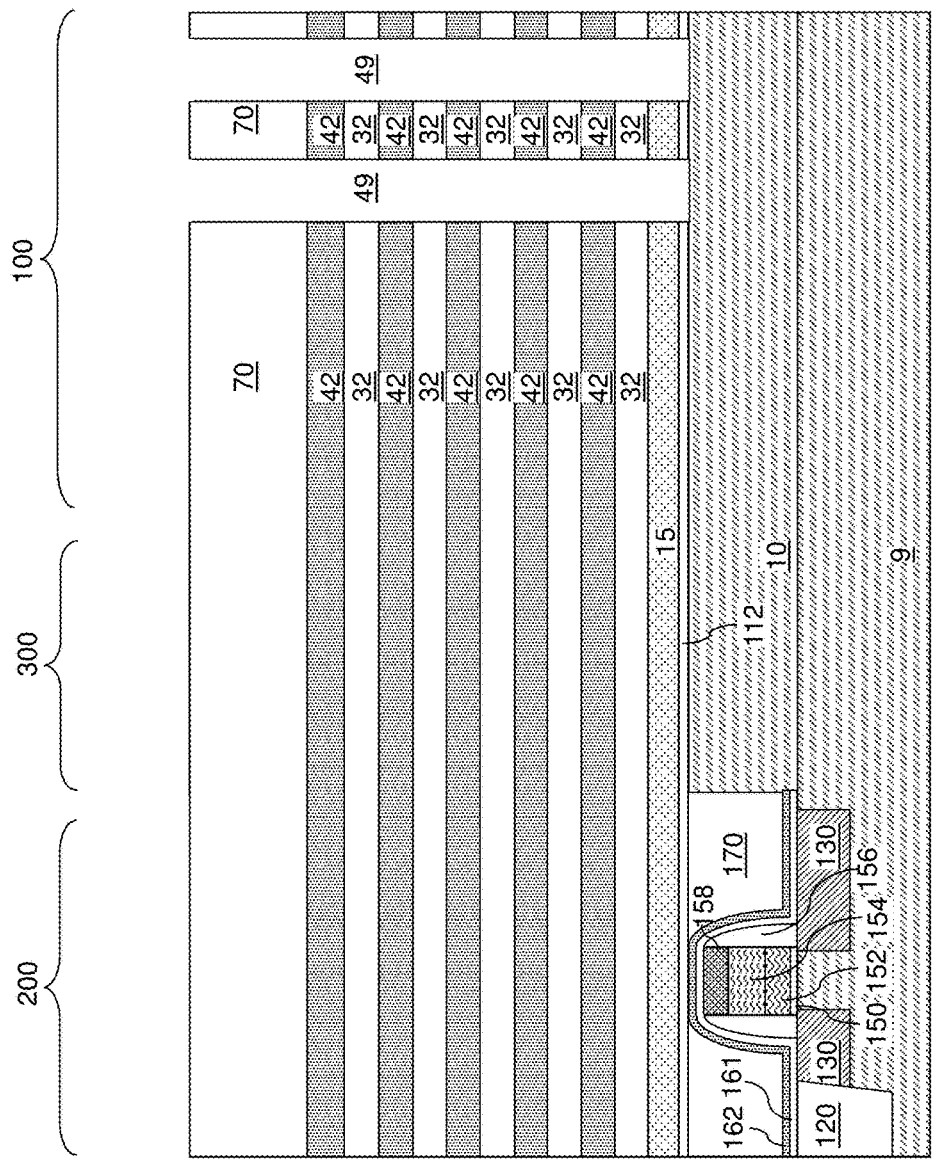
FIG. 3 is a vertical cross-sectional view of the exemplary structure after formation of memory openings according to an embodiment of the present disclosure.

Referring to FIG. 3, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42), the bottom sacrificial material layer 15, and the bottom dielectric layer 112 by at least one anisotropic etch that employs the patterned lithographic material stack as an etch mask. Portions of the alternating stack (32, 42), the bottom sacrificial material layer 15, and the bottom dielectric layer 112 that underlie the openings in the patterned lithographic material stack are etched to form memory openings 49. In other words, the transfer of the pattern in the patterned lithographic material stack through the alternating stack (32, 42), the bottom sacrificial material layer 15, and the bottom dielectric layer 112 forms the memory openings 49 that extend to a top semiconductor surface of the semiconductor substrate (9, 10). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The memory openings 49 can be formed as a two-dimensional array.

A memory stack structure can be formed in each of the memory opening employing various embodiments of the present disclosure. FIGS. 4A-4F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 3.

Referring to FIG. 4A, a memory opening 49 after the processing steps of FIG. 3 is illustrated. The memory opening 49 extends through the insulating cap layer 70, the alternating stack (32, 42), the bottom sacrificial material layer 15, and the bottom dielectric layer 112. The bottom surface of the memory opening 49 can be coplanar with the top surface of the semiconductor material layer 10.

An epitaxial channel portion 11 can be formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor material layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor material layer 10. Each epitaxial channel portion 11 functions as a portion of a channel of a vertical field effect transistor.

Each epitaxial channel portions 11 includes a single crystalline semiconductor material that grows from a physically exposed semiconductor surface of the substrate (9, 10) from underneath the respective memory opening 49. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49. The volume of each memory opening 49 is reduced by the growth of the epitaxial channel portion 11.

Referring to FIG. 4B, a series of layers including at least one optional blocking dielectric layer 502, a memory material layer 504, a tunneling dielectric layer 505, and an optional first semiconductor channel layer 601L can be sequentially deposited in the memory openings 49. The at least one blocking dielectric layer 502 can include a single blocking dielectric layer or a layered stack of a plurality of blocking dielectric layers.

The at least one blocking dielectric layer 502 can be deposited on the sidewalls of each memory opening 49 by a conformal deposition method. The outer sidewall of the at least one blocking dielectric layer 502 can contact sidewalls of the bottom dielectric layer 112, and the bottom sacrificial material layer 15. The at least one blocking dielectric layer 502 includes a dielectric material, which can be silicon oxide and/or a dielectric metal oxide. In one embodiment, the at least one blocking dielectric layer 502 can be a silicon oxide layer. The thickness of the at least one blocking dielectric layer 502 can be in a range from 3 nm to 12 nm, although lesser and greater thicknesses can also be employed.

Subsequently, the memory material layer 504, the tunneling dielectric layer 505, and the optional first semiconductor channel layer 601L can be sequentially formed. In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into spacer material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The tunneling dielectric layer 505 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505 can include a stack of a first silicon oxide layer, a silicon oxynitride layer, and a second silicon oxide layer, which is commonly known as an ONO stack. In one embodiment, the tunneling dielectric layer 505 can include a silicon oxide layer that is substantially free of carbon or a silicon oxynitride layer that is substantially free of carbon. The thickness of the tunneling dielectric layer 505 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (502, 504, 505, 601L).

Figure 4C:
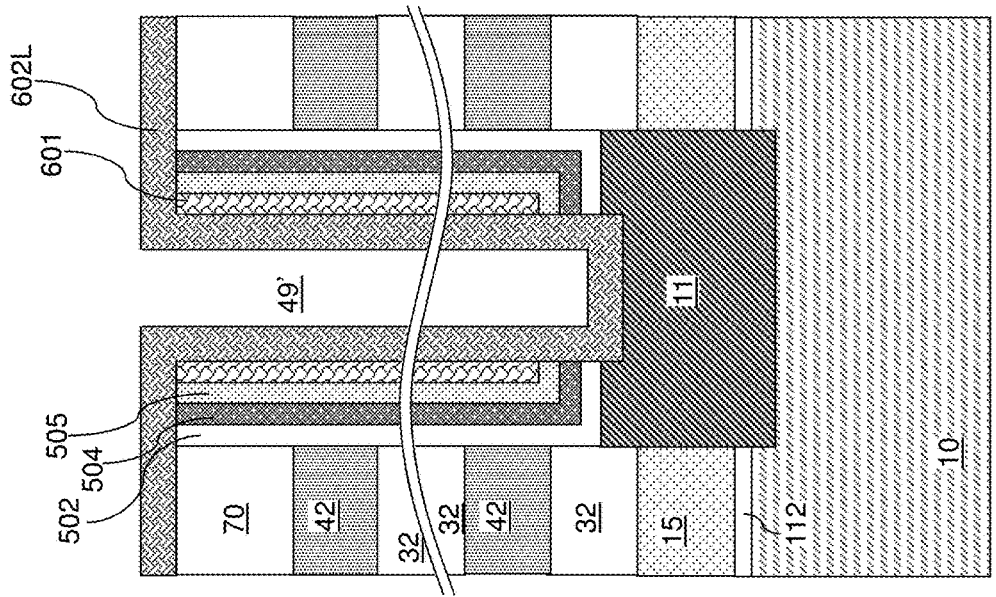

Referring to FIG. 4C, the optional first semiconductor channel layer 601L, the tunneling dielectric layer 505, the memory material layer 504, the at least one blocking dielectric layer 502 are sequentially anisotropically etched employing at least one anisotropic etch process. The portions of the first semiconductor channel layer 601L, the tunneling dielectric layer 505, the memory material layer 504, and the at least one blocking dielectric layer 502 located above the top surface of the insulating cap layer 70 can be removed by the at least one anisotropic etch process. Further, the horizontal portions of the first semiconductor channel layer 601L, the tunneling dielectric layer 505, the memory material layer 504, and the at least one blocking dielectric layer 502 at a bottom of each cavity 49' can be removed to form openings in remaining portions thereof. Each of the first semiconductor channel layer 601L, the tunneling dielectric layer 505, the memory material layer 504, and the at least one blocking dielectric layer 502 can be etched by anisotropic etch process.

Each remaining portion of the first semiconductor channel layer 601L constitutes a first semiconductor channel portion 601. Each remaining portion of the memory material layer 504 includes at least one charge storage element, and can include a plurality of charge storage elements. In one embodiment, the number of the charge storage elements in a memory material layer 504 can be at least the total number of control gate electrodes to be formed around the memory material layer 504. In one embodiment, the memory material layer 504 can be a contiguous layer, i.e., can be a charge storage layer. A surface of the semiconductor material layer 10 (or the substrate semiconductor layer 9 if the semiconductor material layer 10 is not present) can be physically exposed underneath the opening through the first semiconductor channel portion 601, the tunneling dielectric layer 505, the memory material layer 504, and the at least one blocking dielectric layer 502. Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance. A tunneling dielectric layer 505 is surrounded by a memory material layer 504. The memory material layer 504 can comprise a charge trapping material or a floating gate material.

In one embodiment, the first semiconductor channel portion 601, the tunneling dielectric layer 505, the memory material layer 504, and the at least one blocking dielectric layer 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 4D:
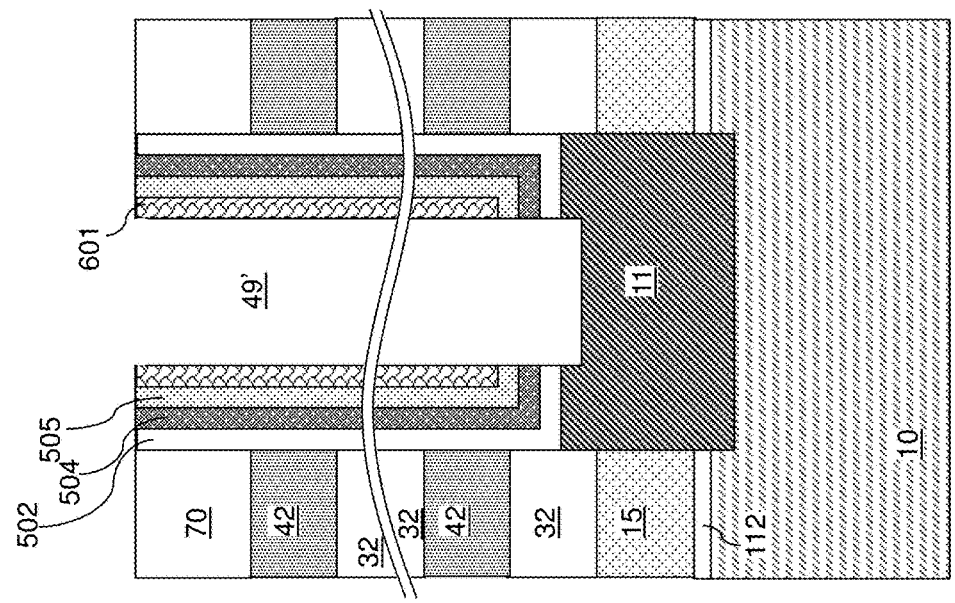

Referring to FIG. 4D, a second semiconductor channel layer 602L can be deposited directly on the semiconductor surface of the epitaxial channel portion 11, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 4E, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 4F, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A tunneling dielectric layer 505 is surrounded by a memory material layer 504, and laterally surrounds a portion of the vertical semiconductor channel 60. Each adjoining set of at least one blocking dielectric layer 502, a memory material layer 504, and a tunneling dielectric layer 505 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. Within each memory opening, a lateral stack is formed, which includes, from outside to inside, a memory film 50 and a vertical semiconductor channel 60. The combination of the memory film 50 and the vertical semiconductor channel 60 comprise a memory stack structure 55.

Multiple instances of the exemplary memory stack structure of FIG. 4F, or a derivative thereof, can be embedded into the exemplary structure illustrated in FIG. 3.

Figure 5:
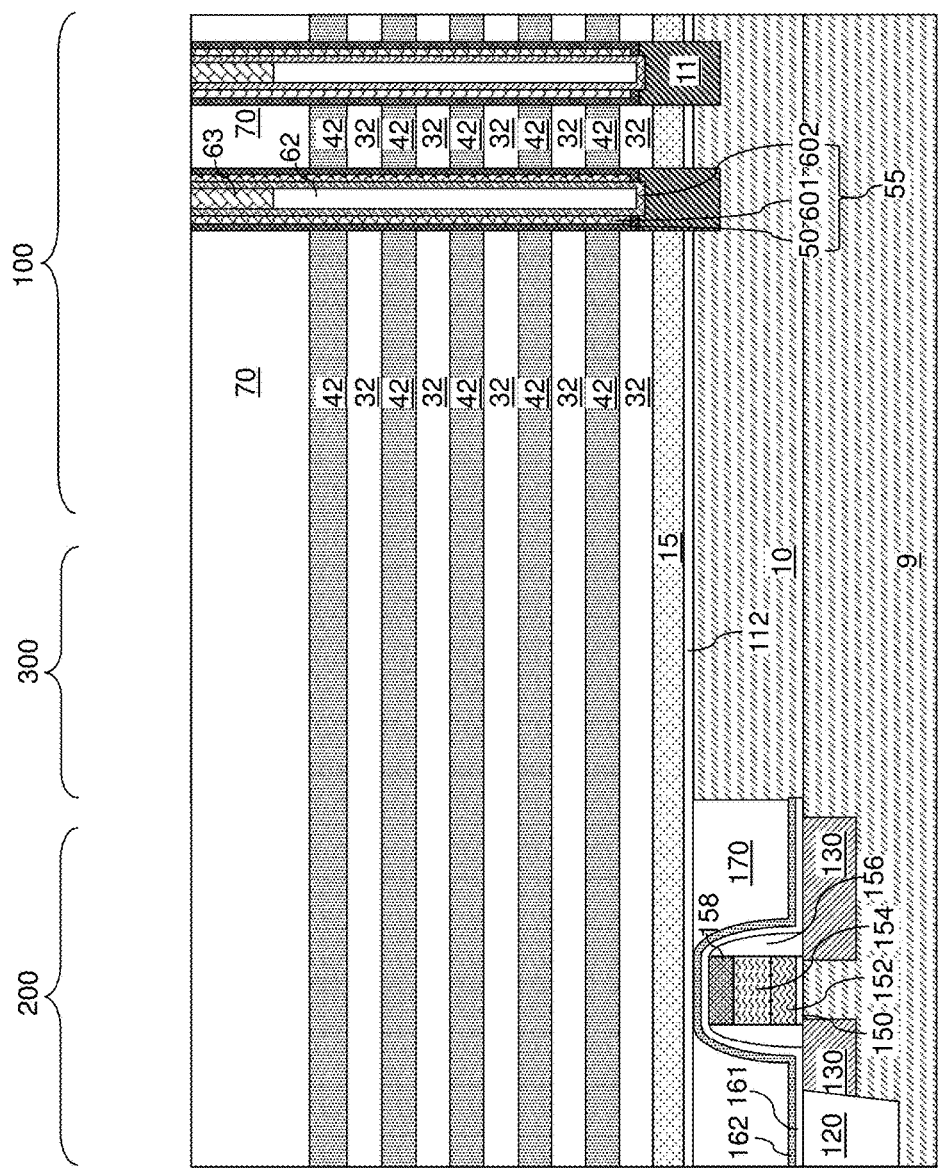
FIG. 5 is a vertical cross-sectional view of the exemplary structure after formation of memory stack structures according to an embodiment of the present disclosure.

FIG. 5 illustrates the exemplary structure that incorporates multiple instances of the exemplary memory stack structure of FIG. 4F. The exemplary structure includes a semiconductor device, which comprises a stack (32, 42) including an alternating plurality of material layers (e.g., the spacer material layers 42) and insulating layers 32 located over a semiconductor substrate (9, 10), and a memory opening extending through the stack (32, 42). The semiconductor device further comprises at least one blocking dielectric layer 502 vertically extending from a horizontal plane including the interface between the semiconductor substrate (9, 10) and the bottom dielectric layer 112 to the insulating cap layer 70.

Figure 6:
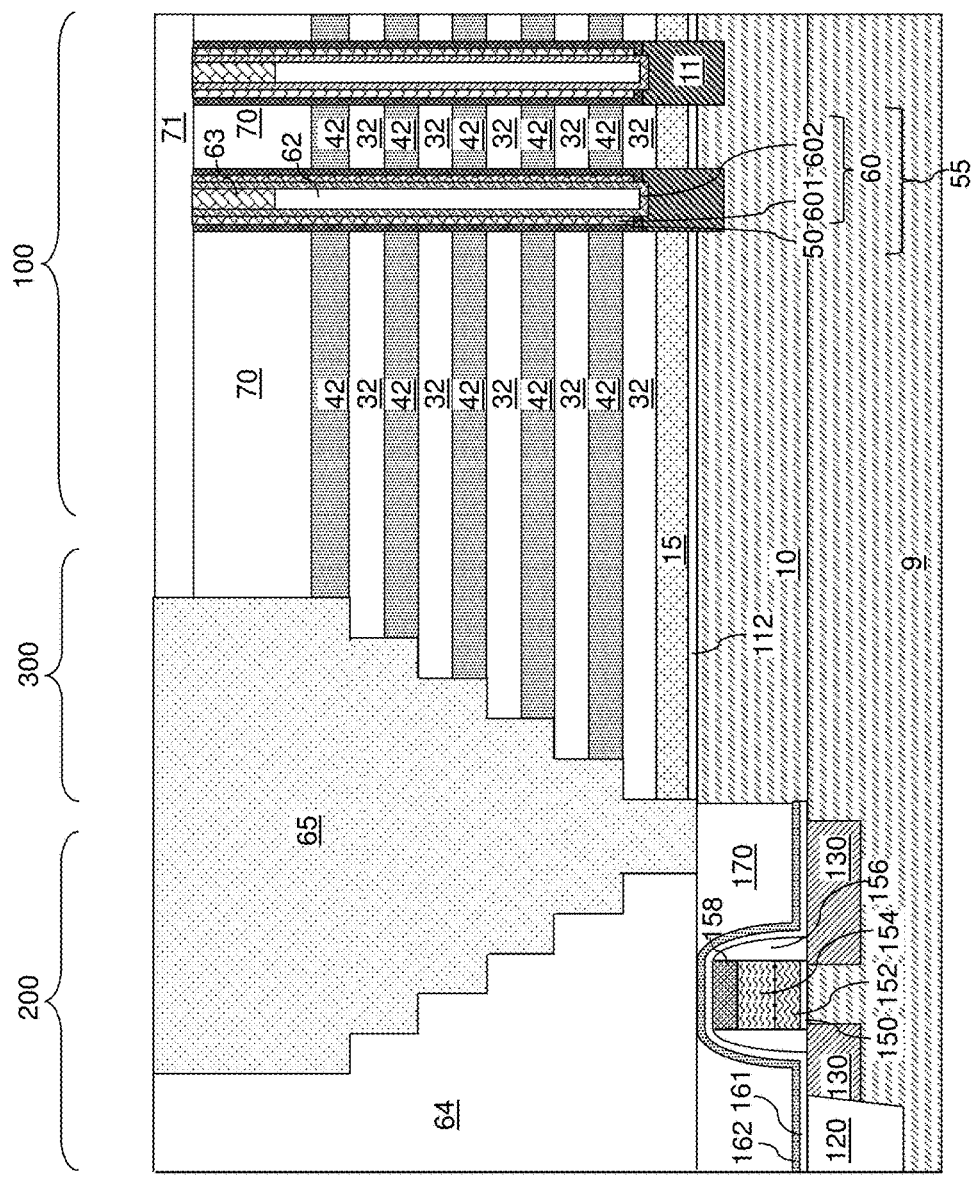
FIG. 6 is a vertical cross-sectional view of the exemplary structure after formation of a stepped terrace and a retro-stepped dielectric material portion according to an embodiment of the present disclosure.

Referring to FIG. 6, a first contact level dielectric layer 71 can be optionally formed over the planarization dielectric layer 70. The first contact level dielectric layer 71 can include a dielectric material that can be employed as a stopping layer in a subsequent planarization process. In one embodiment, the first contact level dielectric layer 71 can include a dielectric metal oxide, silicon nitride, a nitrogen-containing organosilicate glass, silicon oxynitride, and/or silicon oxide. The thickness of the first contact level dielectric layer 71 can be in a range from 10 nm to 300 nm, although lesser and greater thicknesses can also be employed.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes the peripheral device region 200 and a portion of a contact region 300, which is adjacent to the device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 7A:
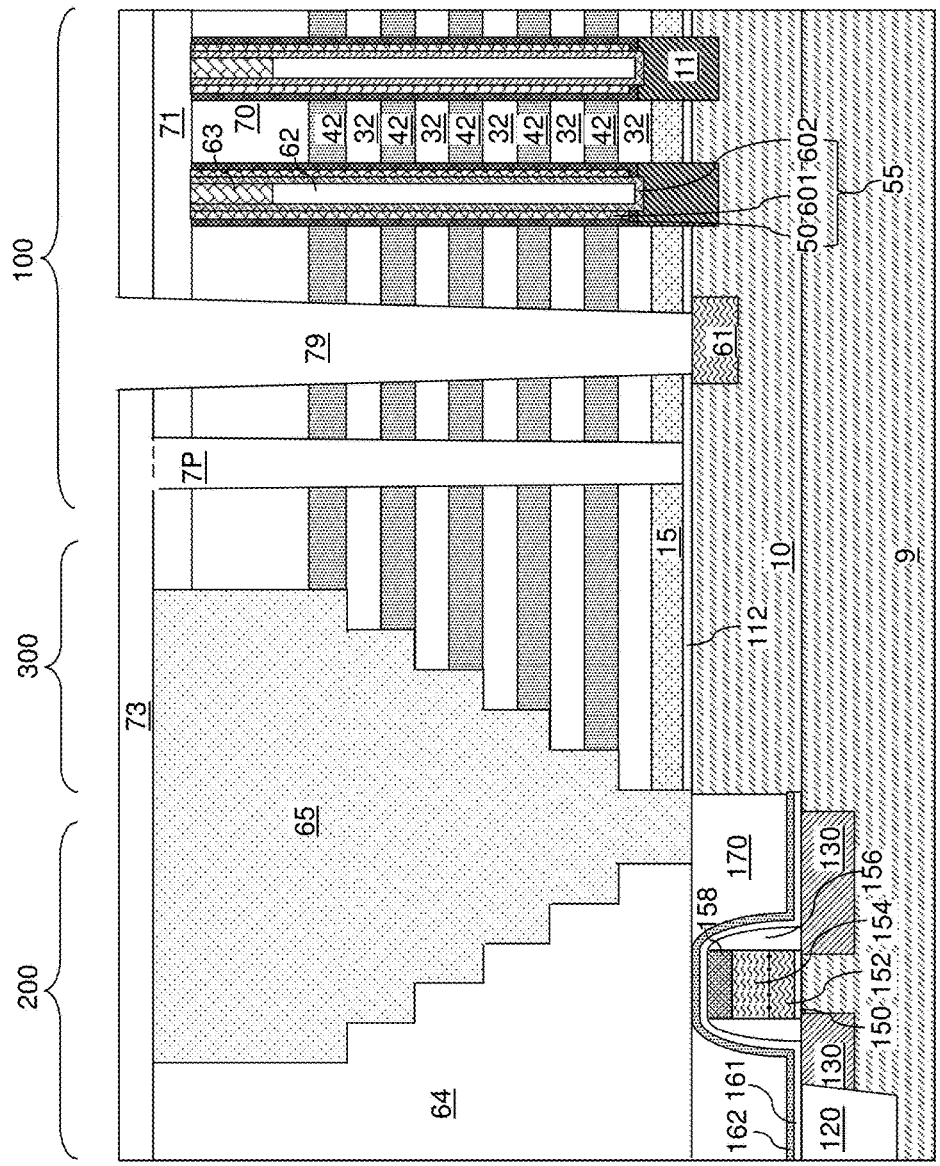
FIG. 7A is a vertical cross-sectional view of the exemplary structure after formation of a backside contact trench according to an embodiment of the present disclosure.
Figure 7B:
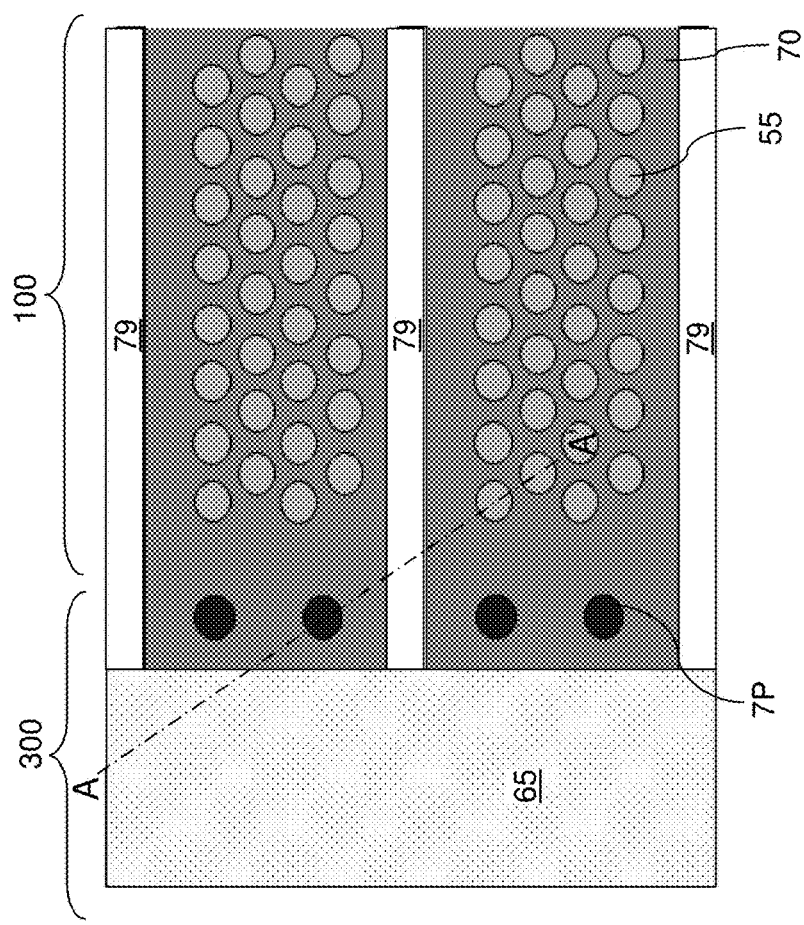
FIG. 7B is a see-through top-down view of the exemplary structure of FIG. 7A. The vertical plane A-A' is the plane of the vertical cross-sectional view of FIG. 7A.

Referring to FIGS. 7A and 7B, at least one dielectric support pillar 7P may be optionally formed through the retro-stepped dielectric material portion 65 and/or through the alternating stack (32, 42). The plane A-A' in FIG. 7B corresponds to the plane of the vertical cross-sectional view of FIG. 7A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the spacer material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area adjacent to an array of memory stack structures 55. The pattern in the photoresist layer can be transferred through the alternating stack (32, 42) and/or the retro-stepped dielectric material portion 65, and through the bottom sacrificial material layer 15 and the bottom dielectric layer 112 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. In one embodiment, the at least one backside contact trench 79 can be a line-shaped trench that extends along a horizontal direction as illustrated in FIG. 7B.

FIGS. 8A-8D illustrate a first exemplary processing sequence for forming electrically conductive layers according to a first embodiment of the present disclosure. Referring to FIG. 8A, the backside contact trench 79 and the adjacent memory stack structure 55 in the exemplary structure of FIGS. 7A and 7B are illustrated.

Referring to FIG. 8B, a first backside recess 143 can be formed by removing the bottom sacrificial material layer 15 selective to the insulating layers 32, the spacer material layers 42, the bottom dielectric layer 112, and the physically exposed semiconductor material of the semiconductor substrate (9, 10). In one embodiment, the insulating layers 32 can comprise silicon oxide and the spacer material layers 42 can comprise silicon nitride, and the bottom sacrificial material layer 15 can comprise a material selected from amorphous semiconductor material and a polycrystalline semiconductor material (e.g., amorphous silicon or polysilicon). In this case, a wet etch process employing trimethyl-2 hydroxyethyl ammonium hydroxide (TMY) can be employed to remove the amorphous semiconductor material (such as amorphous silicon) or the polycrystalline semiconductor material (such as a polycrystalline silicon or silicon-germanium alloy material) selective to the semiconductor material of the semiconductor substrate (9, 10) (such as single crystalline silicon). In another embodiment, the insulating layers 32 can comprise silicon oxide and the spacer material layers 42 can comprise silicon nitride, and the bottom sacrificial material layer 15 can comprise a material selected from a doped silicate glass (e.g., BSG, PSG or BPSG), organosilicate glass, and a porous dielectric material. In this case, a wet etch process employing dilute hydrofluoric acid can be employed to remove the material of the bottom sacrificial material layer 15 selective to the materials of the insulating layers 32, the spacer material layers 42, the bottom dielectric layer 112, and the physically exposed semiconductor material of the semiconductor substrate (9, 10). For example, a $HF/H_2O$ vapor derived from azeotropic solution of $HF/H_2O$ may be used. A sidewall of each epitaxial channel portion 11 can be physically exposed to the first backside recess 143 upon formation of the first backside recess 143.

Subsequently, an oxidation process can be performed to form a semiconductor oxide layer 212 underneath the bottom dielectric layer 112 and around the material of each epitaxial channel portion 11. The oxidation process provides an oxygen-containing species through the backside contact trench 79 and the first backside recess 143 to the sidewall of each epitaxial channel portion 11, to a surface portion of the of the semiconductor substrate (9, 10) underlying the backside contact trench 79. The oxidation process provides an oxygen-containing species to the portion of the surface of the semiconductor substrate (9, 10) underlying the bottom dielectric layer 112 by diffusion through the bottom dielectric layer 112. The oxidation process can include an oxidation process selected from a thermal oxidation process, a plasma oxidation process, and a combination thereof. For example, water vapor generator (WVG) oxidation, such as oxidation using water vapor from a catalytic water vapor generator, may be used.

The semiconductor oxide layer 212 can be formed, in part, by oxidizing a side surface portion of the epitaxial channel portion 11 that is physically exposed to the first backside recess 143. Further, the semiconductor oxide layer 212 can be formed, in part, by oxidizing a surface portion of the semiconductor substrate (9, 10) underlying the bottom dielectric layer 212. Specifically, the semiconductor oxide layer 212 can be formed between the bottom dielectric layer 112 and the semiconductor substrate (9, 10) by conversion of an interfacial portion of the semiconductor oxide that contacts the bottom dielectric layer 112 into a continuous semiconductor oxide portion that continuously extends from underneath the backside contact trench 79 to the epitaxial channel portion 11. Thus, the semiconductor oxide layer 212 comprises an oxidized surface portion of the epitaxial channel portion 11 underlying the sidewall of the epitaxial channel portion 11, and an oxidized surface portion of the semiconductor substrate (9, 10) underlying the bottom dielectric layer 112. The bottom dielectric layer 112 and the semiconductor oxide layer 212 can be collectively employed as a gate dielectric 12 for a horizontal semiconductor channel (e.g., the channel of the source select gate transistor of the NAND device), which is a surface portion of the semiconductor material layer 10 between the backside contact trench 79 and an epitaxial channel portion 11.

Referring to FIG. 8C, a source region 61 can be formed in each surface portion of the semiconductor material layer 10 that underlies the at least one backside contact trench 79. Each source region 61 can be formed by implanting electrical dopants of the same conductivity type as the doping type of the drain regions 63. In one embodiment, each source region 61 can be formed by implantation of electrical dopants in a region of the semiconductor substrate (9, 10) that underlies the backside contact trench 79, for example, by ion implantation or plasma doping.

In one embodiment, at least the portion of the semiconductor material layer 10 underlying the memory stack structures 55 and the at least one backside contact trench 79 can have a doping of a first conductivity type (which can be p-type or n-type), and the at least one source region 61 and the drain regions 63 can have a doping of a second conductivity type that is the opposite of the first conductivity type. The vertical semiconductor channels 60 can have a doping of the first conductivity type, or can be intrinsic. The bottom dielectric layer 112 of the gate dielectric 12 can extend between a source region 61 and an epitaxial channel portion 11. Alternatively, formation of the source regions 61 can be performed at any later processing step prior to formation of contact via structures in the backside contact trenches 79.

Referring to FIG. 8D, an etchant that selectively etches the second material of the spacer material layers 42 with respect to the first material of the insulating layers 32 can be introduced into the at least one backside contact trench 79, for example, employing an etch process. Second backside recesses are formed in volumes from which the spacer material layers 42 are removed. The removal of the second material of the spacer material layers 42 can be selective to the first material of the insulating layers 32, the material of the at least one dielectric support pillar 7P, the material of the retro-stepped dielectric material portion 65, the semiconductor material of the semiconductor material layer 10, the material of the bottom dielectric layer 112, and the semiconductor oxide layer 212. In one embodiment, the spacer material layers 42 can include silicon nitride, and the materials of the insulating layers 32, the at least one dielectric support pillar 7P, and the retro-stepped dielectric material portion 65 can be selected from silicon oxide and dielectric metal oxides.

The etch process that removes the second material selective to the first material and the outermost layer of the memory films 50 can be a wet etch process, or can be a gas phase (dry) etch process in which the etchant is introduced in a vapor phase into the at least one backside contact trench 79. For example, if the spacer material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the second backside recesses are present within volumes previously occupied by the spacer material layers 42.

Each second backside recess can be a laterally extending cavity having a lateral dimension that is greater than the vertical extent of the cavity. In other words, the lateral dimension of each second backside recess can be greater than the height of the second backside recess. A plurality of second backside recesses can be formed in the volumes from which the second material of the spacer material layers 42 is removed. The memory openings 49 in which the memory stack structures 55 are formed are herein referred to as front side recesses or front side cavities in contrast with the second backside recesses. In one embodiment, the device region 100 comprises an array of monolithic three-dimensional NAND strings having a plurality of device levels disposed above the substrate (9, 10). In this case, each second backside recess can define a space for receiving a respective word line of the array of monolithic three-dimensional NAND strings.

Each of the plurality of second backside recesses can extend substantially parallel to the top surface of the substrate (9, 10). A second backside recess can be vertically bounded by a top surface of an underlying insulating layer 32 and a bottom surface of an overlying insulating layer 32. In one embodiment, each second backside recess can have a uniform height throughout.

Optionally, a backside blocking dielectric layer 701 can be formed in the first and the second backside recesses on the surfaces of the insulating layers 32, the semiconductor oxide layer 112, the insulating cap layer 70, the first contact level dielectric layer 71, and the second contact level dielectric layer 73. As used herein, a "backside" blocking dielectric layer refers to a blocking dielectric layer located outside, or at a peripheral portion of, a memory opening. The backside blocking dielectric layer 701 can comprise a material that is different from, or the same as, the material of the at least one blocking dielectric layer 502 (See FIG. 4B). For example, the backside blocking dielectric layer 701 can comprise a dielectric metal oxide (such as aluminum oxide), and the at least one blocking dielectric layer 502 can comprise silicon oxide. The optional backside blocking dielectric layer 701 can function, in conjunction with the at least one blocking dielectric layer 502, as an additional dielectric material layer that blocks leakage of stored electrical charges to control gate electrodes. In one embodiment, the backside blocking dielectric layer 701 includes aluminum oxide. Alternatively, the at least one blocking dielectric layer 502 may be omitted, and a backside blocking dielectric layer 701 may be the only dielectric material between charge storage elements and control gate electrodes.

At least one conductive material can be simultaneously deposited in the first backside recess 143 and in the plurality of second backside recesses, on sidewalls of the at least one the backside contact trench 79, and over the top surface of the second contact level dielectric layer 73. As used herein, a conductive material refers to an electrically conductive material. Each conductive material can be deposited by a conformal deposition method, which can be, for example, chemical vapor deposition (CVD), atomic layer deposition (ALD), electroless plating, electroplating, or a combination thereof. Each conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of second backside recesses include tungsten, tungsten nitride, titanium, titanium nitride, tantalum, and tantalum nitride. The at least one conductive material is deposited directly on horizontal surfaces of the insulating layers 32 and on the outer sidewalls of the at least one blocking dielectric layer 502.

In one embodiment, the at least one conductive material can comprise a metal such as tungsten and/or metal nitride. In one embodiment, the at least one conductive material for filling the first backside recess 143 and the plurality of second backside recesses can be selected from tungsten and a combination of titanium nitride and tungsten. In one embodiment, the at least one conductive material can be deposited by chemical vapor deposition. In one embodiment, the at least one conductive can include a first conductive material comprising a conductive metallic compound and a metallic material comprising an elemental metal or an alloy of at least two elemental metals. The second metallic material can be selected from an elemental metal and an alloy of at least two elemental metals.

In an illustrative example, the deposited conductive material layers can include a metallic liner 46A comprising the second conductive metallic compound and a metallic fill material layer 46B comprising the second metallic material. In one embodiment, the metallic liner 46A can include a conductive metallic nitride such as TiN, TaN, WN, or a combination or an alloy thereof, and/or a conductive metallic carbide such as TiC, TaC, WC, or a combination or an alloy thereof. The metallic fill material layer 46B can comprise an elemental metal such as W, Cu, Al, Ta, Co, Ni, Pt, Mo, and Ru, or a stack thereof, or an alloy thereof. In one embodiment, the metallic liner 46A can include titanium nitride, and the metallic fill material layer 46B can comprise tungsten.

A combination of a portion of the metallic liner 46A and a portion of the metallic fill material layer 46B that fills each second backside recess constitutes an electrically conductive layer 46. A plurality of electrically conductive layers 46 can be formed in the combination of the first backside recess 143 and the plurality of second backside recesses, and a contiguous conductive material layer can be formed on the sidewalls of each backside contact trench 79 and over the second contact level dielectric layer 73 (or the topmost layer of the exemplary structure in case the second contact level dielectric layer 73 is not employed). Thus, at least a portion of each spacer material layer 42 can be replaced with an electrically conductive layer 46, which is a conductive material portion.

The deposited conductive material of the contiguous conductive material layer is etched back from the sidewalls of each backside contact trench 79 and from above the second contact level dielectric layer 73 (or the topmost layer of the exemplary structure in case the second contact level dielectric layer 73 is not employed), for example, by an isotropic etch. Each remaining portion of the deposited conductive material in the second backside recesses constitutes an electrically conductive layer 46. Each electrically conductive layer 46 can be a conductive line structure.

The electrically conductive layers 46 can comprise a first electrically conductive layer formed in the first backside recess 143 and second electrically conductive layers formed in the second backside recesses. The first and second electrically conductive layers are formed simultaneously. The electrically conductive layer 46 that is formed in the first backside recess 143 can function as a source select gate electrode for the three-dimensional memory device including the memory stack structures 55. Each electrically conductive layer 46 formed in the second backside recesses can function as a combination of a plurality of control gate electrodes and a word line electrically connecting, i.e., electrically shorting, the plurality of control gate electrodes.

The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices. Furthermore, one or more of the top electrically conductive layers 46 in the stack may function as the drain select gate electrode for the device.

An insulating spacer 74 can be formed on the sidewalls of the backside contact trench 79 by deposition of a contiguous dielectric material layer and an anisotropic etch of its horizontal portions. Each insulating spacer 74 can be formed on a sidewall of the backside contact trench 79 and on a periphery of a top surface of the semiconductor substrate (9, 10) underneath the backside contact trench 79. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

Each cavity laterally surrounded by the insulating spacer 74 can be filled with at least one conductive material to form backside contact structures 76. For example, a backside contact structure 76 can be formed in the cavity surrounded by the insulating spacer 74. Each backside contact structure 76 can be formed on an inner sidewall of an insulating spacer 74. In one embodiment, each backside contact structure 76 can include a backside contact metallic liner 76A including a conductive diffusion barrier material such as TiN, TaN, and/or WN, and a conductive fill material portion 76B including a conductive metal such as W, Al, Cu, Ru, and/or a conductive doped semiconductor material, such as heavily doped polysilicon. The embodiment of FIGS. 8A-8D results in a thicker gate oxide 12 of the bottom select gate transistor by preventing or reducing the nitridized gate oxide formation under the stack which inhibits the gate oxide 12 thickening during the oxidation process shown in FIG. 8B. This in turn reduces or prevents unintentional breakdown of the bottom source select transistor gate oxide 12 due to thinner gate oxide formation under the stack.

Figures 9A, 9B:
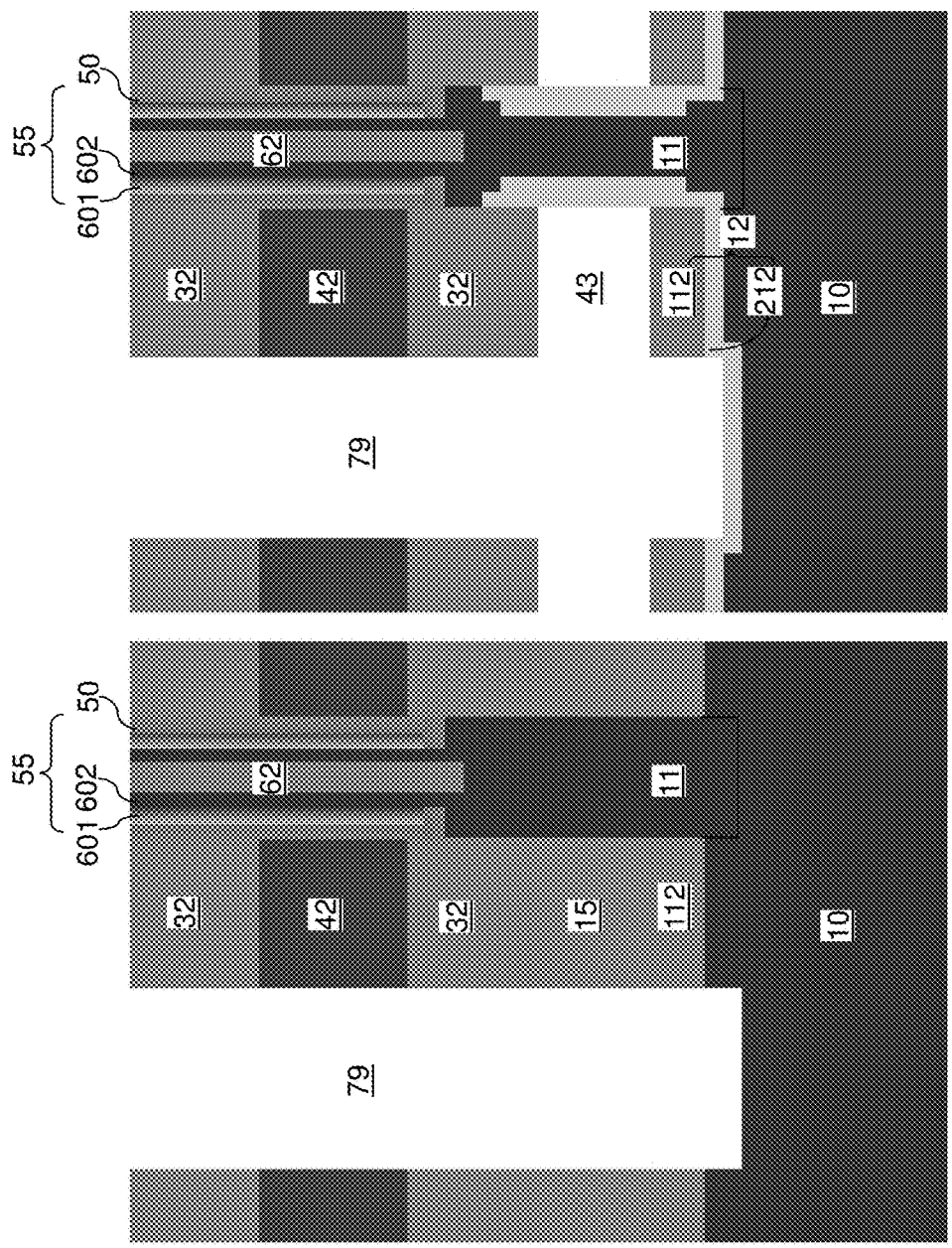

FIGS. 9A-9G illustrate a second exemplary processing sequence for forming electrically conductive layers according to a second embodiment of the present disclosure. Referring to FIG. 9A, a backside contact trench 79 and an adjacent memory stack structure 55 in the exemplary structure of FIGS. 7A and 7B are illustrated, which can be the same as the structure illustrated in FIG. 8A.

Referring to FIG. 9B, the processing steps of FIG. 8B can be performed to form a semiconductor oxide layer 212.

Figures 9C, 9D:
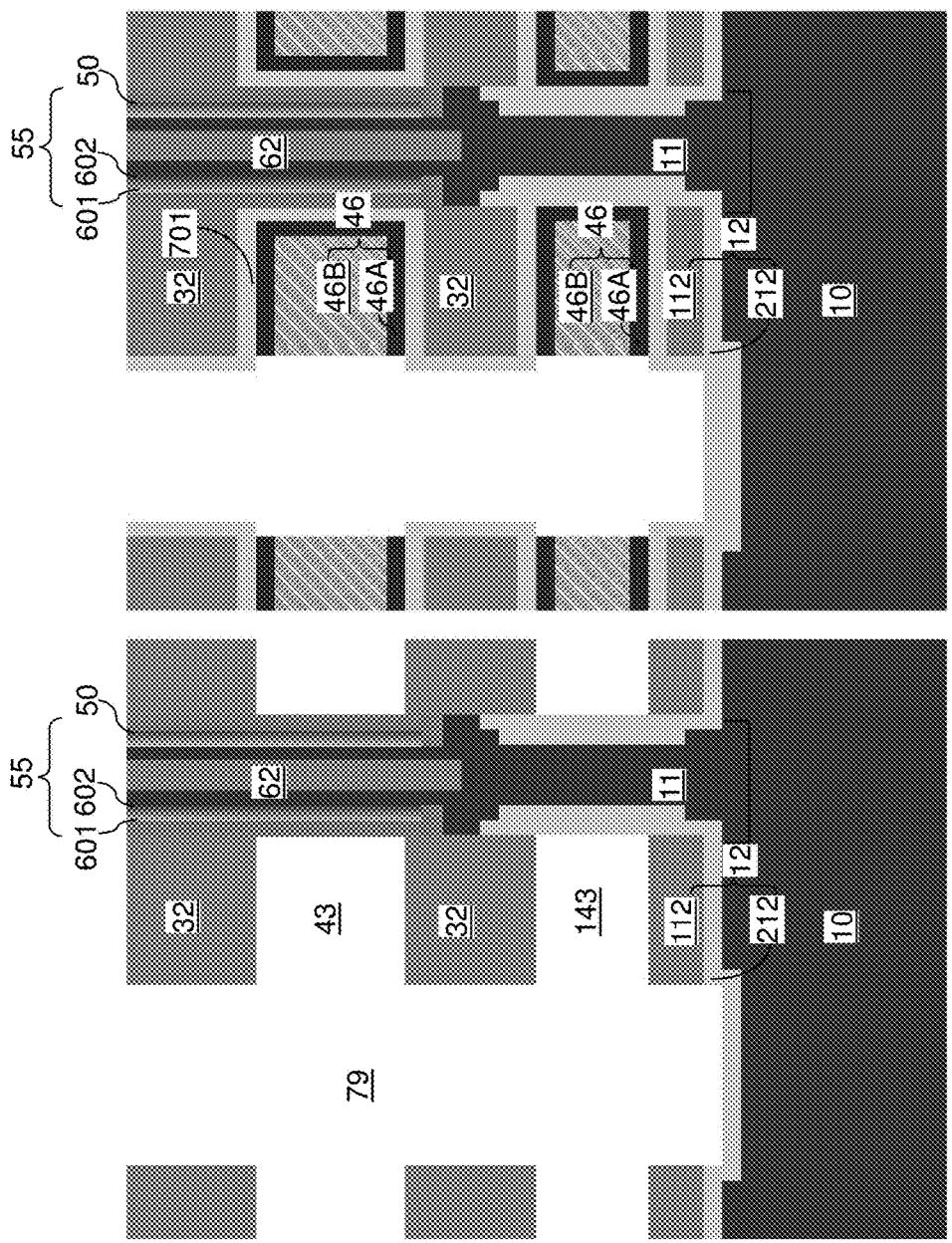

Referring to FIG. 9C, the spacer material layers 42 can be removed selective to the insulating layers 32, the bottom dielectric layer 112, and the semiconductor oxide layer 212 to form second backside recesses 43. Processing steps of FIG. 8C may be employed. Formation of a source region 61 underneath each backside contact trench 79 may be performed at a later processing step (which corresponds to the embodiment illustrated herein), or may be performed at the processing step of FIG. 9C (in the same manner as in the processing steps of FIG. 8C).

Referring to FIG. 9D, a subset of processing steps shown in FIG. 8D up to the etch back of the deposited conductive material of the contiguous conductive material layer can be performed to provide the structure of FIG. 9D. Specifically, layers 701 and 46 are formed and layers 46 are removed from the backside trench 76.

Referring to FIG. 9E, an aluminum oxide liner 702 is deposited on sidewalls of the electrically conductive layers 46, and on sidewalls of the backside blocking dielectric layer 701 (if present) or on sidewalls of the insulating layers 32 (in case the backside blocking dielectric layer 701 is not employed) at a periphery of each backside contact trench 79. The aluminum oxide liner 702 can be formed by a conformal deposition process such as atomic layer deposition or chemical vapor deposition. The thickness of the aluminum oxide liner 702 can be in a range from 1 nm to 20 nm, although lesser and greater thicknesses can also be employed. A backside cavity 79' surrounded by the aluminum oxide liner 702 is present within each backside contact trench 79.

Referring to FIG. 9F, an insulating material liner 74L can be formed on the aluminum oxide liner 702 by a conformal deposition process such as atomic layer deposition or chemical vapor deposition. The insulating material liner 74L can include a dielectric material that is different from aluminum oxide. In one embodiment, the insulating material liner 74L can include silicon oxide. The thickness of the insulating material liner 74L can be in a range from 3 nm to 60 nm, although lesser and greater thicknesses can also be employed.

Figure 9G:
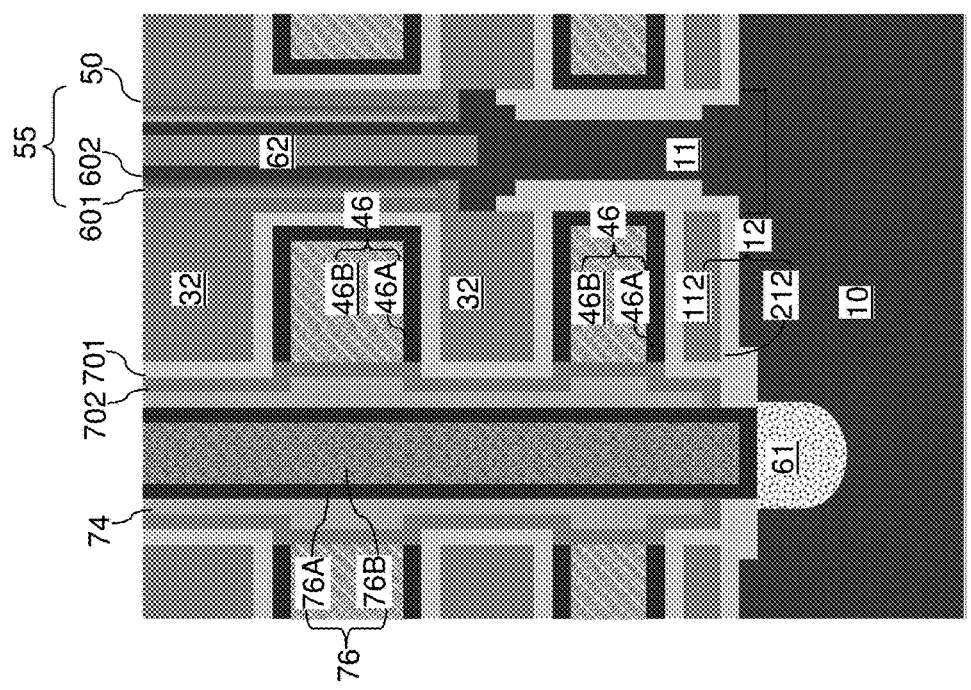

Referring to FIG. 9G, an anisotropic etch process is performed to remove horizontal portions of the insulating material liner 74L, the aluminum oxide liner 702 and backside blocking dielectric 701 (if present) in the backside trench 79. A combination of the remaining vertical portion of the insulating material liner 74L and the remaining vertical portion of the aluminum oxide liner 702 inside a backside contact trench constitutes an insulating spacer (74, 702) or (74, 702, 701). If the backside blocking dielectric 701 is present, then in this embodiment, the aluminum oxide material of the spacer at the levels of the insulating layers 32 is thicker than at the levels of the electrically conductive layers 46. In other words, the spacer comprises portions of three layers 74, 702 and 701 at the levels of the insulating layers 32 and portions of two layers 74 and 702 at the levels of the electrically conductive layers 46.

A source region 61 may then be ion implanted into the semiconductor substrate (9, 10) through the remaining portion of the backside trench 79 and activated by annealing.

Each cavity laterally surrounded by the insulating spacer (74, 702) can be filled with at least one conductive material to form backside contact structures 76. For example, a backside contact structure 76 can be formed in the cavity surrounded by the insulating spacer (74, 702). Each backside contact structure 76 can be formed on an inner sidewall of an insulating spacer (74, 702). In one embodiment, each backside contact structure 76 can include a backside contact metallic liner 76A including a conductive diffusion barrier material such as TiN, TaN, and/or WN, and a conductive fill material portion 76B including a conductive metal such as W, Al, Cu, Ru, and/or a conductive doped semiconductor material. The aluminum oxide liner 702 in the insulating spacer (74, 702) can reduce the leakage current along the backside contact trench 79. Especially, the aluminum oxide liner 702 in the insulating spacer (74, 702) can reduce the leakage current between the source select gate electrode (which is a portion of the bottommost electrically conductive layer 46) and the semiconductor substrate (9, 10). The addition of layer 702 to the spacer blocks fluorine outgassing if tungsten word lines 46B are formed using a tungsten hexafluoride CVD source, improves the voltage breakdown margin (the $V_{bd}$ margin), and reduces short circuits between the backside contact structure 76 (i.e., a source electrode or local interconnect) and the word lines 46.

FIGS. 10A-10F illustrate a third exemplary processing sequence for forming electrically conductive layers according to a third embodiment of the present disclosure. Referring to FIG. 10A, a backside contact trench 79 and an adjacent memory stack structure 55 in the exemplary structure of FIGS. 7A and 7B are illustrated, which can be the same as the structure illustrated in FIG. 8A.

Referring to FIG. 10B, a subset of the processing steps of FIG. 8B can be performed to form a first backside recess 143. Formation of layer 212 takes place at a later step in the process of this embodiment.

Referring to FIG. 10C, a selective epitaxy process is performed to deposit a single crystalline semiconductor material on the sidewall of each epitaxial channel portion 11 and on the physically exposed surface of the semiconductor substrate (9, 10) underlying each backside contact trench 79. The selective epitaxy process employed at this step is herein referred to as a second selective epitaxy process, whereas the selective epitaxy process employed to form the epitaxial channel portions 11 at a processing step of FIG. 4A is herein referred to as a first selective epitaxy process. The second selective epitaxy process can employ any of the process conditions that can be employed for the first selective epitaxy process. The epitaxial channel portions 11 may be pre-cleaned prior to the second selective epitaxy process.

Each epitaxial channel portion 11 is laterally grown outward (i.e., parallel to the top surface 7 of the substrate) into the first backside recess 143 during the second selective epitaxy process. An annular epitaxial portion 211 is added to the epitaxial channel portion 11 by the second selective epitaxy process. The annular epitaxial portion 211 can have the same semiconductor material as (e.g., single crystal silicon), or can have a different semiconductor material from, the epitaxial channel portion 11. Optionally, annular epitaxial portion 211 can be p-type doped (e.g., boron-doped) or n-type doped (e.g., arsenic-doped or phosphorus-doped). The doping can be done in-situ or ex-situ, and plasma doping or any other kind doping methods may be employed. The single crystalline semiconductor material of each annular epitaxial portion 211 can be epitaxially aligned to the single crystalline semiconductor material of the epitaxial channel portion 11. Each adjoining set of an epitaxial channel portion 11 and an annular epitaxial portion 211 constitutes a laterally grown epitaxial channel portion 11', which is an epitaxial channel portion that includes a laterally grown portion, i.e., the annular epitaxial portion 211.

An epitaxial material portion 210 can be grown from each physically exposed surface of the semiconductor substrate (9, 10) underlying the at least one backside contact trench 79 concurrently with the growth of the annular epitaxial portions 211, i.e., during the second epitaxy process. The epitaxial material portion 210 includes the same semiconductor material as the annular epitaxial portions 211 (e.g., single crystal silicon).

Referring to FIG. 10D, an oxidation process can be performed to form a semiconductor oxide layer 212 (e.g., silicon oxide). Any of the oxidation processes that can be employed for the oxidation process of FIG. 8B can be employed to form the semiconductor oxide layer 212. The semiconductor oxide layer 212 underneath the bottom dielectric layer 112 and around the material of each epitaxial channel portion 11, and specifically, around the material of the laterally grown epitaxial channel portion 11' (e.g., on portion 211). The oxidation process provides an oxygen-containing species through the backside contact trench 79 and the first backside recess 143 to the sidewall of each laterally grown epitaxial channel portion 11' (which is an epitaxial channel portion with a lateral protrusion), to a surface portion of the of the semiconductor substrate (9, 10) underlying the backside contact trench 79. The oxidation process provides an oxygen-containing species to the portion of the surface of the semiconductor substrate (9, 10) underlying the bottom dielectric layer 112 by diffusion through the bottom dielectric layer 112. The oxidation process can include an oxidation process selected from a thermal oxidation process, a plasma oxidation process, and a combination thereof. For example, a WVG oxidation process may be used.

The semiconductor oxide layer 212 can be formed, in part, by oxidizing a surface portion 211 of the laterally grown epitaxial channel portion 11' that is physically exposed to the first backside recess 143. Further, the semiconductor oxide layer 212 can be formed, in part, by oxidizing a surface portion of the semiconductor substrate (9, 10) underlying the bottom dielectric layer 212 and by oxidizing at least an upper portion of each epitaxial material portion 210. Particularly, the semiconductor oxide layer 212 can be formed between the bottom dielectric layer 112 and the semiconductor substrate (9, 10) by conversion of an interfacial portion of the semiconductor oxide that contacts the bottom dielectric layer 112 into a continuous semiconductor oxide portion that continuously extends from underneath the backside contact trench 79 to the laterally grown epitaxial channel portion 11'.

The semiconductor oxide layer 212 includes a portion that is formed by oxidation of a surface portion of the epitaxial channel portion 11 formed by the first epitaxy process and located at the level of the bottom dielectric layer 112. Further, the semiconductor oxide layer 212 includes another portion that is formed by oxidation of the surface portion of an annular epitaxial portion 211 formed by the second epitaxy process. Thus, the semiconductor oxide layer 212 comprises an oxidized surface portion of the laterally grown epitaxial channel portion 11 underlying the sidewall of the epitaxial channel portion 11', and an oxidized surface portion of the semiconductor substrate (9, 10) underlying the bottom dielectric layer 112. The bottom dielectric layer 112 and the semiconductor oxide layer 212 can be collectively employed as a gate dielectric 12 for a horizontal semiconductor channel, which is a surface portion of the semiconductor material layer 10 between the backside contact trench 79 and an epitaxial channel portion 11.

Referring to FIG. 10E, the spacer material layers 42 can be removed selective to the insulating layers 32, the bottom dielectric layer 112, and the semiconductor oxide layer 212 to form second backside recesses 43, for example, employing the processing steps of FIG. 8D. Additional processing steps of FIG. 8D can be performed up to the etch back of the deposited conductive material of the contiguous conductive material layer to provide the structure of FIG. 10E. This embodiment reduces or prevents undesirable inward (convex) curvature of the epitaxial channel portion 11 during the oxidation step that forms the oxide layer 212 (i.e., the gate oxide of the source select transistor).

Additional processing steps of FIG. 8D can be performed to form the structure illustrated in FIG. 10F. Alternatively, the processing steps of FIGS. 9E-9G can be performed to deposit layer 702 to form the insulating spacer (74, 702) of FIG. 9G.

Figure 11:
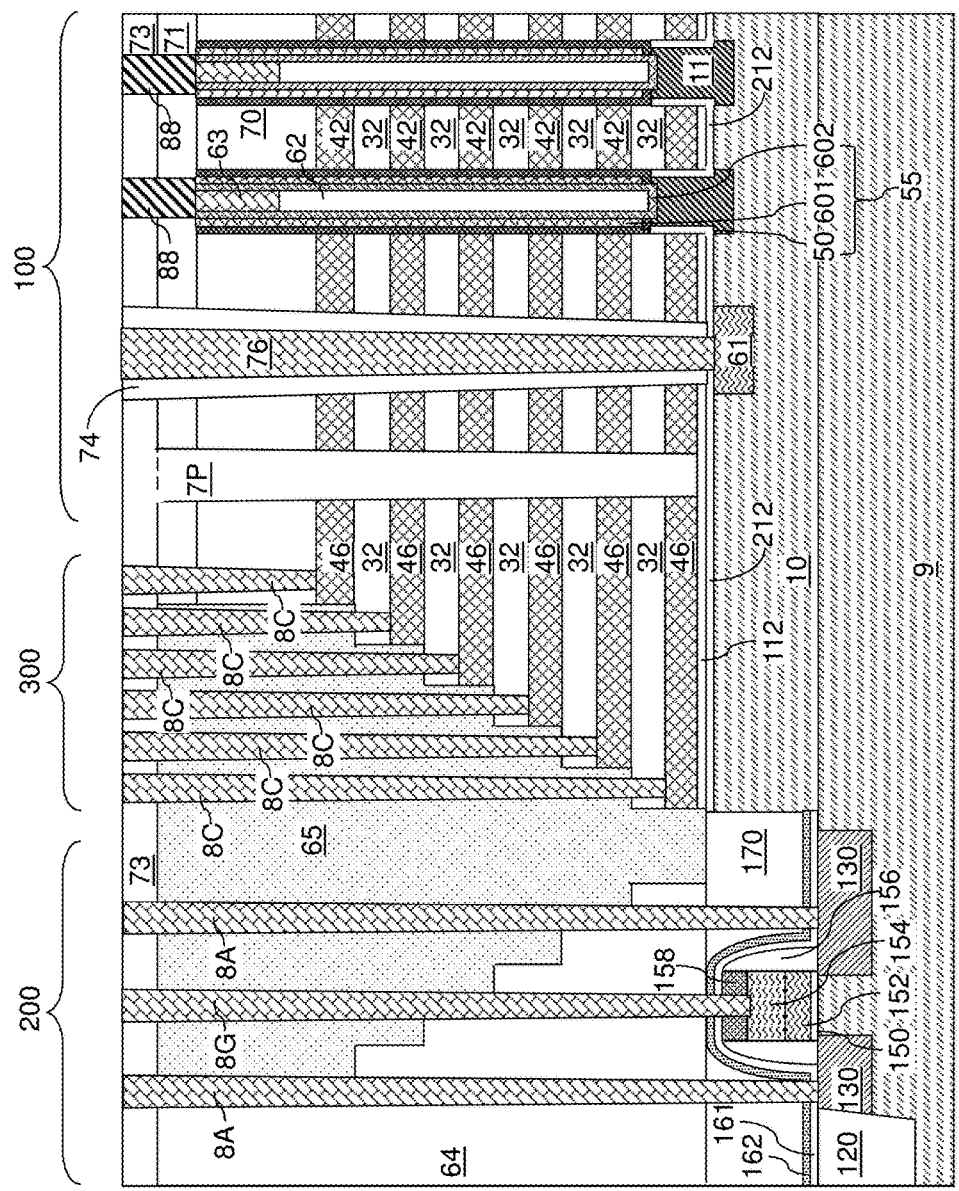
FIG. 11 is a vertical cross-sectional view of the exemplary structure after formation of various additional contact via structures according to an embodiment of the present disclosure.

Referring to FIG. 11, a photoresist layer (not shown) can be applied over the topmost layer (e.g., layer 73) of the exemplary structures of FIG. 8D, 9G or 10F and can be lithographically patterned to form various openings therein. An anisotropic etch is performed to etch through the various layers overlying the electrical nodes of the semiconductor devices underneath to physically expose various conductive components of the electrical nodes. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. Control gate via cavities can be formed over the stepped surfaces in the contact region 300 so that top surfaces of the electrically conductive layers 46 are physically exposed. Drain contact via cavities can be formed over the drain regions 63 so that top surfaces of the drain regions 63 are physically exposed. In one embodiment, different types of via cavities can be formed separately employing multiple combinations of photoresist layers and anisotropic etch processes. The photoresist layer can be removed, for example, by ashing after the respective anisotropic etch processes.

The various via cavities can be filled with at least one conductive material to form various contact via structures. For example, a gate contact via structure 8G can be formed in each gate via cavity in the peripheral device region 200, and an active region via structure 8A is formed in each active region via cavity in the peripheral device region 200. Drain contact via structures 88 can be formed in the drain contact via cavities in the device region 100. Further, control gate contact via structures 8C can be formed within each contact via cavity that extends to a top surface of the electrically conductive layers 46 in the contact region 300.

According to an aspect of the present disclosure, various exemplary structures of the present disclosure can include a monolithic three-dimensional memory device. The monolithic three-dimensional memory device includes: an alternating stack of insulating layers 32 and electrically conductive layers 46 located over a semiconductor substrate (9, 10); a memory stack structure 55 extending through an upper portion of the alternating stack and comprising, from outside to inside, memory elements (which may be embodied as portions of the memory material layer 504 that are located at each level of the electrically conductive layers 46), a tunneling dielectric 505, and a vertical semiconductor channel (601, 602); and an epitaxial channel portion 11' underlying the memory stack structure 55 and contacting a bottom surface of the vertical semiconductor channel (601, 602) and a portion of a top surface of the semiconductor substrate (9, 10). A sidewall of the epitaxial channel portion 11' protrudes outward from a vertical plane including an interface between sidewalls of the alternating stack and a sidewall of the memory stack structure 55, as shown in FIG. 10F.

In one embodiment, a semiconductor oxide layer 212 including a portion located on the sidewall of the epitaxial channel portion 11' can be provided. In one embodiment, a source region 61 can be located in an upper portion of the semiconductor substrate (9, 10). The semiconductor oxide layer 212 continuously extends from the sidewall of the epitaxial channel portion 11' to the source region 61.

In one embodiment, a bottom dielectric layer 112 can be located underneath the alternating stack and can contact a top surface and a sidewall surface of the semiconductor oxide layer 212. In one embodiment, a bottommost electrically conductive layer among the electrically conductive layers 46 (e.g., the source select gate electrode) contacts an outer sidewall of the semiconductor oxide layer 212.

According to an aspect of the present disclosure, various exemplary structures of the present disclosure can include a monolithic three-dimensional memory device. The monolithic three-dimensional memory device includes: an alternating stack of insulating layers 32 and electrically conductive layers 46 located over a semiconductor substrate (9, 10); a memory stack structure 55 extending through an upper portion of the alternating stack and comprising, from outside to inside, memory elements (which may be embodied as portions of the memory material layer 504 that are located at each level of the electrically conductive layers 46), a tunneling dielectric 505, and a vertical semiconductor channel (601, 602); an epitaxial channel portion (11 or 11') underlying the memory stack structure 55 and contacting a bottom surface of the vertical semiconductor channel (601, 602) and a portion of a top surface of the semiconductor substrate (9, 10); a source region 61 located in an upper portion of the semiconductor substrate (9, 10); a contact via structure 76 extending through the alternating stack and contacting the source region 61; and an insulating spacer (74, 702) laterally surrounding the contact via structure 76 and comprising a dielectric material liner 74 that contacts the contact via structure 76 and an aluminum oxide liner 702 that surrounds the dielectric material liner 74, as shown in FIG. 9G.

In one embodiment, a semiconductor oxide layer 212 can extend from a sidewall of the epitaxial channel portion (11 or 11') to the source region 61. A bottom dielectric layer 112 can be located underneath the alternating stack, can contact a top surface of the semiconductor oxide layer 212, and can laterally surround a bottom portion of the epitaxial channel portion (11 or 11'). In one embodiment, a bottommost electrically conductive layer among the electrically conductive layers 46 can contact an outer sidewall of the semiconductor oxide layer 212.

In each embodiment of the present disclosure, the three-dimensional semiconductor device may include a vertical NAND device located over the substrate (9, 10). The electrically conductive layers 46 can include, or can be electrically connected to, a respective word line (as embodied as portions that surround the memory stack structures 55) of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings can be located over another memory cell in a second device level of the three-dimensional array of NAND strings. The silicon substrate can contain an integrated circuit comprising a driver circuit for the memory device located thereon. The array of monolithic three-dimensional NAND strings can include a plurality of semiconductor channels, a plurality of charge storage elements, and a plurality of control gate electrodes having a strip shape extending substantially parallel to the top surface of the substrate (9, 10). At least one end portion of each of the plurality of semiconductor channels can extend substantially perpendicular to a top surface 7 of the substrate (9, 10). Each charge storage element can be located adjacent to a respective one of the plurality of semiconductor channels (601, 602). The plurality of control gate electrodes can comprise at least a first control gate electrode located in the first device level and a second control gate electrode located in the second device level.

The various embodiments of the present disclosure can suppress or eliminate electrical shorts of the select gate electrodes (as embodied as the bottommost electrically conductive layer 46) of the bottom select gate transistors at locations adjacent to the epitaxial channel portion (11 or 11') or adjacent to the contact via structure 76 by enabling formation of uniform semiconductor oxide layer 212 that is not retarded by regions of residual silicon nitride, which would be present if the bottom sacrificial material layer 15 were to comprise a silicon nitride layer similar to the remaining sacrificial material layers 42 in the stack. Further, the various embodiments of the present disclosure can reduce electrical shorts of word lines (as embodied as the electrically conductive layers 46) to the contact via structures 76 through the use of the aluminum oxide liner 702.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a three-dimensional memory device, comprising:
    forming, from bottom to top, a bottom dielectric layer, a bottom sacrificial material layer, and an alternating stack of insulating layers and spacer material layers over a semiconductor substrate;
    forming a memory opening through the alternating stack, the bottom sacrificial material layer, and the bottom dielectric layer;
    forming an epitaxial channel portion and a memory stack structure in the memory opening;
    forming a backside contact trench through the alternating stack, the bottom sacrificial material layer, and the bottom dielectric layer;
    forming a first backside recess by removing the bottom sacrificial material layer selective to the insulating layers, the spacer material layers, and the bottom dielectric layer;
    forming a semiconductor oxide layer underneath the bottom dielectric layer and around a material of the epitaxial channel portion;
    forming second backside recesses by removing the spacer material layers selective to the insulating layers, the bottom dielectric layer, and the semiconductor oxide layer; and
    forming electrically conductive layers in the first and second backside recesses.

2. The method of claim 1, wherein the semiconductor oxide layer is formed by introduction of an oxygen-containing species through the backside contact trench and the first backside recess.

3. The method of claim 1, wherein the semiconductor oxide layer comprises silicon oxide which is formed by an oxidation of silicon selected from a thermal oxidation process, a plasma oxidation process, and a combination thereof.

4. The method of claim 1, wherein:
    a sidewall of the epitaxial channel portion is physically exposed in the first backside recess upon formation of the first backside recess; and
    the semiconductor oxide layer comprises an oxidized side surface portion of the epitaxial channel portion.

5. The method of claim 4, wherein the semiconductor oxide layer is further formed between the bottom dielectric layer and the semiconductor substrate by conversion of an interfacial portion of the semiconductor substrate that contacts the bottom dielectric layer into a continuous semiconductor oxide portion that continuously extends from underneath the backside contact trench to the epitaxial channel portion.

6. The method of claim 1, wherein the bottom sacrificial material layer comprises a material selected from amorphous semiconductor material, a polycrystalline semiconductor material, a doped silicate glass, organosilicate glass, and a porous dielectric material.

7. The method of claim 6, wherein:
    bottom sacrificial material layer comprises amorphous silicon, polysilicon or doped silicate glass;
    the insulating layers comprise silicon oxide;
    the spacer material layers comprise silicon nitride.

8. The method of claim 1, further comprising laterally growing the epitaxial channel portion into the first backside recess employing a selective epitaxy process after formation of the first backside recess.

9. The method of claim 8, wherein the semiconductor oxide layer is formed, in part, by oxidizing a surface portion of the laterally grown epitaxial channel portion and oxidizing a sidewall of the epitaxial channel portion underlying the laterally grown epitaxial channel portion.

10. The method of claim 1, further comprising:
    forming an aluminum oxide liner on sidewalls of the electrically conductive layers at a periphery of the backside contact trench;
    forming an insulating material liner on the aluminum oxide liner; and
    forming an insulating spacer by anisotropically etching the insulating material liner and the aluminum oxide liner.

11. The method of claim 10, further comprising:
    forming a source region by implantation of electrical dopants in a region of the semiconductor substrate that underlies the backside contact trench; and
    forming a source contact via structure within the backside contact trench inside the insulating spacer.

12. The method of claim 1, wherein the electrically conductive layers comprise a source select gate electrode of a vertical NAND device formed in the first backside recess and control gate electrodes of the vertical NAND device formed in the second backside recesses formed simultaneously with the source select gate electrode.

13. The method of claim 1, wherein:
    the three-dimensional memory device comprises a vertical NAND device located over the substrate;
    the electrically conductive layers comprise, or are electrically connected to, a respective word line of the vertical NAND device;
    the substrate comprises a silicon substrate;
    the vertical NAND device comprises an array of monolithic three-dimensional NAND strings located over the silicon substrate;
    at least one memory cell in a first device level of the three-dimensional array of NAND strings is located over another memory cell in a second device level of the three-dimensional array of NAND strings;
    the silicon substrate contains an integrated circuit comprising a driver circuit for the memory device located thereon; and the array of monolithic three-dimensional NAND strings comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

\* \* \* \* \*